United States Patent [19]

Volpi et al.

[11] 4,267,597

[45] May 12, 1981

[54] MARINE TELEPHONE RADIO

[75] Inventors: John P. Volpi, Garland; Robert R. Kyle, Plano, both of Tex.

[73] Assignee: Texas Instruments Incorporated, Dallas, Tex.

[21] Appl. No.: 55,108

[22] Filed: Jul. 5, 1979

[51] Int. Cl.³ .............................................. H04B 1/40
[52] U.S. Cl. ...................................... 455/76; 455/77; 455/79; 455/154; 370/32
[58] Field of Search ................................... 455/76–79, 455/165, 166, 183, 185, 186, 154; 179/2 E, 2 EA, 2 EB; 370/32

[56] References Cited

U.S. PATENT DOCUMENTS

| 4,092,594 | 5/1978 | Baker | 455/165 |
| 4,186,342 | 1/1980 | Kyle | 455/77 |

Primary Examiner—Jin F. Ng
Attorney, Agent, or Firm—Alva H. Bandy; Melvin Sharp; James T. Comfort

[57] ABSTRACT

An improved marine radio telephone is disclosed having a microphone, display, speaker, and controls. The controls include switches and a keyboard located together with a display in a panel, a microphone conveniently located as to the front panel, and a push-to-talk switch incorporated in the microphone. A panel printed wiring board is provided for the control circuits. Digital logic circuits, including a special purpose microcomputer and a power supply mounted on a second printed wiring board, interface with the control circuits and display. The control circuits include circuit blocking means which can be readily removed to permit, when authorized, transmission on Coast Guard auxiliary channels 21, 23, 81, 82, and 83. A frequency synthesizer interfaces between the logic circuits and a transmitter and receiver. The synthesizer and receiver are mounted on a third PWB, and the transmitter is mounted on a fourth printed wiring board. The special purpose microcomputer has an on-chip ROM and RAM processing capability which allows continuous scanning of at least one preselected channel in addition to the scanning of the emergency channel "16" and the automatic switching of power from 25 watt to one watt with the selection of one of the three channels requiring one watt operation.

10 Claims, 22 Drawing Figures

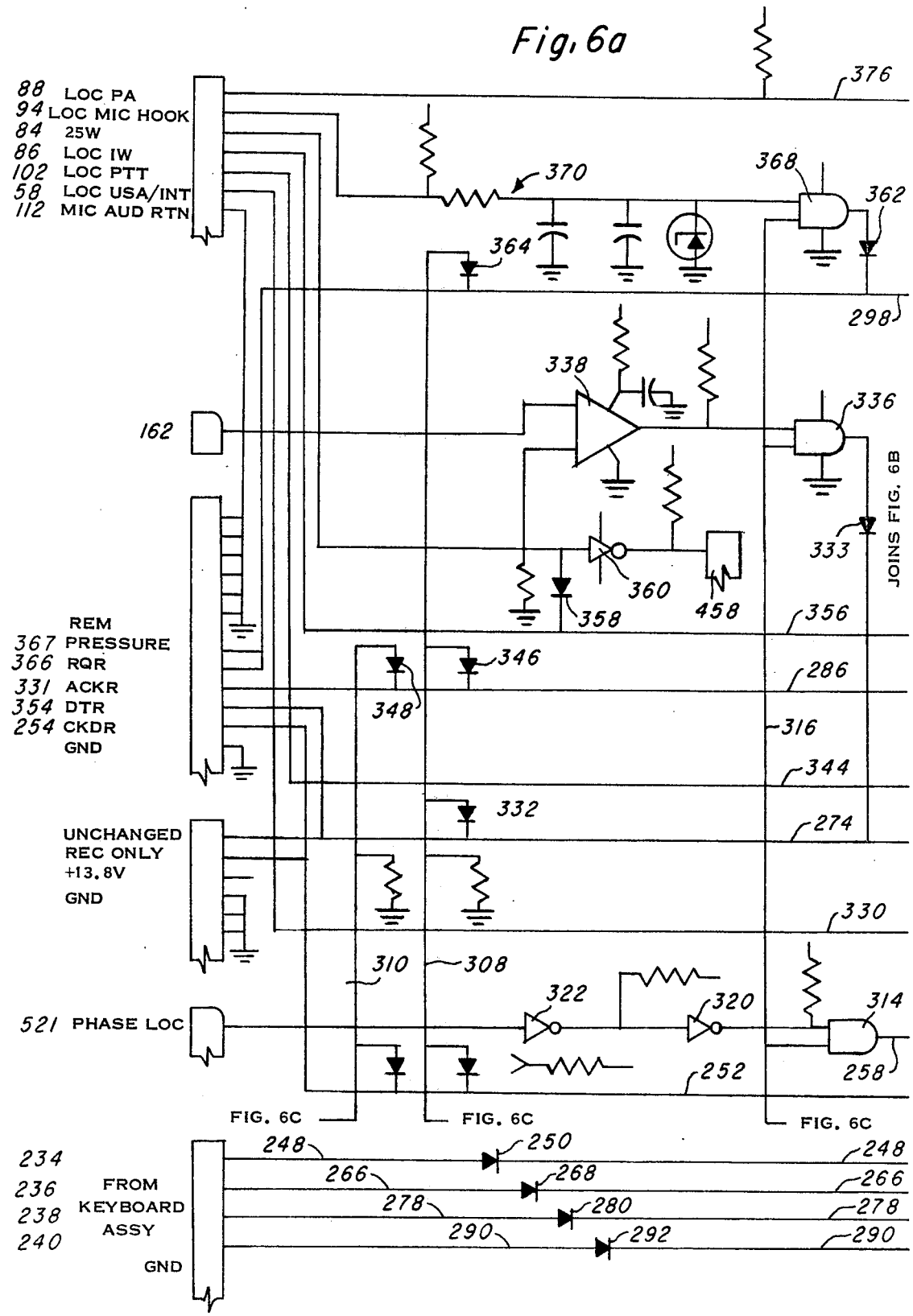

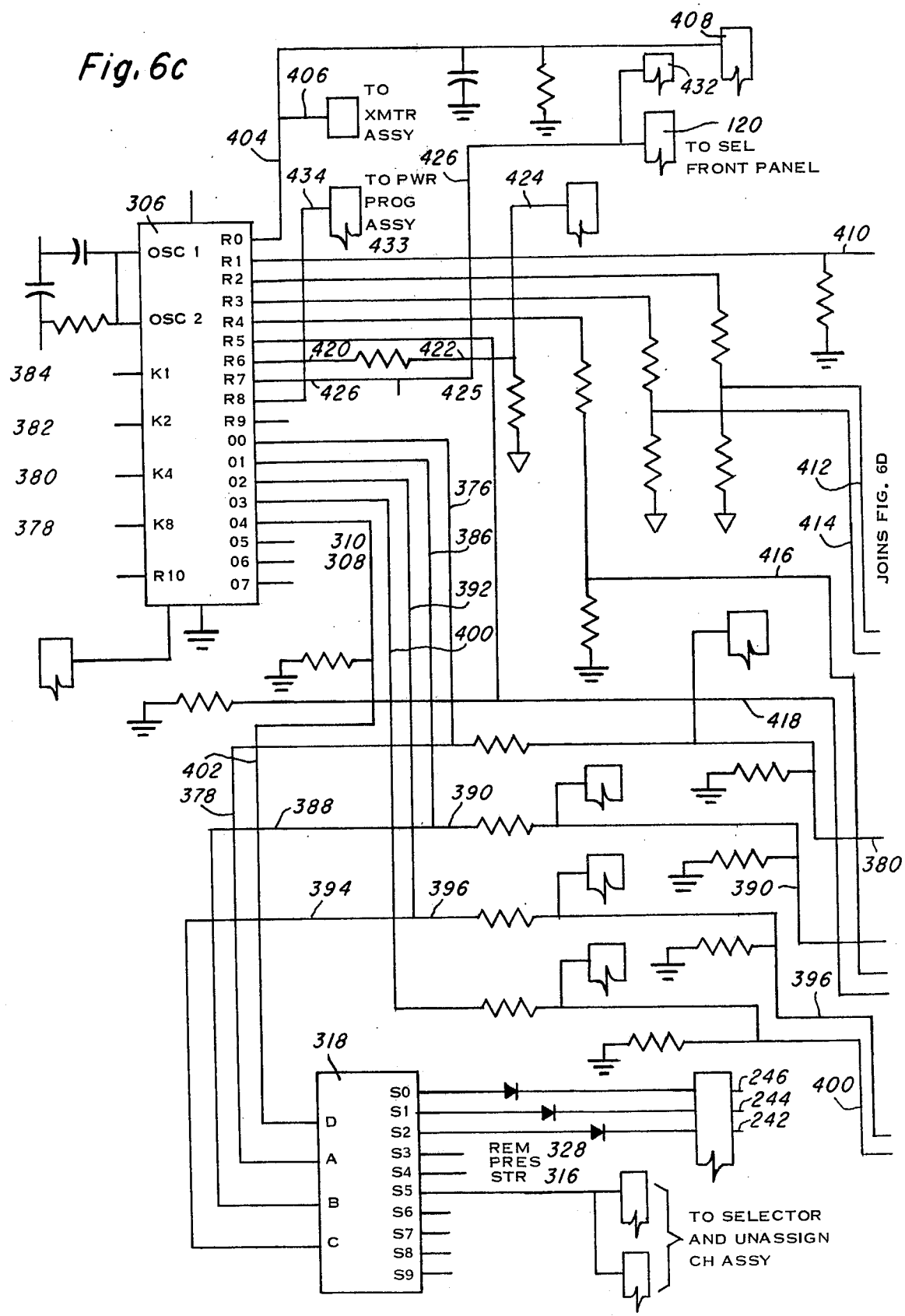

MARINE TELEPHONE RADIO

This invention relates to transceivers and more particularly to an improved solid state, digital VHF marine band radio telephone.

In the past, VHF radio telephones have been able to monitor only one station at a time; channel "16", which is the calling and distress channel, is the station normally monitored. Thus, when one desires to talk to another, he calls on channel "16" and informs the recipient of the station he will use. The receiving party then switches to that channel and awaits the call. At the conclusion of the call, the receiving party switches back to channel "16", or, in the case of the radio telephone disclosed in U.S. Patent application Ser. No. 848,559 filed Nov. 4, 1977, now Pat. No. 4,186,342 issued Jan. 29, 1980, for a "Marine Radio Telephone," the set upon hang-up of the microphone automatically reverts to channel "16" for monitoring. This operation has a disadvantage in that other radio telephones in the area also receive the caller's call, learns of the channel he intends to use and can switch to that station to listen in. This eavesdropping has resulted in boaters having a need for privacy agreeing before going to sea which channel they shall use at sea and setting their radio telephone to that preselected channel. The disadvantage of this is that channel "16", the emergency channel, is not monitored.

Further, FCC rules specifically require operation of channels 13, 15 international, and 17 in the one watt mode. Thus for operation on these channels the operator has had to switch to the one watt power source. The radio telephone of the abovementioned patent application had a transmitter inhibitor which precluded operation from transmitting on channels 13, 15 international and 17 with the power set at 25 W. These prior art devices have the disadvantage of having the operator to select the proper power setting.

Also, the Coast Guard has five auxiliary channels which, unless authorized for transmit by the Coast Guard, can only be utilized in the receive mode. Thus prior art devices have not included a means for adopting the transceiver for transmit. Thus an authorized person would have to purchase a special transceiver or extensively modify the transceiver available to the large number of persons not authorized to transmit on the Coast Guard auxiliary channels.

The above disadvantages are overcome by the present invention which: allows the continuous monitoring of channel "16" and at least one other channel, automatically sets the transmit power to one watt with operator selection of channel 13, 15 international and 17, and permits ready conversion to enable transmission on the Coast Guard auxiliary channels.

Accordingly, it is an object of this invention to provide an improved radio telephone which allows the continuous monitoring of channel "16", the calling and emergency channel, and at least one other channel.

Another object of the invention is to provide a radio telephone having an automatic one watt power setting when channels requiring one watt only operation are selected.

Yet another object of the invention is to provide means for readily converting the unit for transmission on unassigned channels when authorized.

Still another object of the invention is to provide a radio telephone which utilizes a minimum number of parts, is economical to manufacture and has increased reliability.

Still yet another object of the invention is to provide a transceiver automatically controlled to prevent inadvertent violation of FCC rules concerning channel "16" monitoring, frequency selection, power level, and receive only channels.

Briefly stated, the invention comprises a radio telephone or transceiver having a microphone, display, speaker and controls. The controls include switches, and a keyboard located together with the display in a panel with the microphone located on a hook convenient to the front panel. The microphone includes a push-to-talk switch to complete the controls. Digital logic circuits, including a special purpose microcomputer and a power supply provide the interface between the front panel and a frequency synthesizer; while the frequency synthesizer provides the interface between the digital logic circuits and a transmitter and receiver. Four printed wiring boards are used in the unit. The boards are a front panel printed wiring board (PWB), digital logic input and output circuits and power supply PWB, a synthesizer and receiver PWB, and a transmitter PWB. A special purpose microcomputer, included in the digital logic circuits, has an on-chip ROM and RAM processing capability which allows the continuous scanning of at least one preselected channel in addition to the scanning of the emergency channel "16", and the automatic switching of power from 25 watt to 1 watt with the selection of one of the three channels requiring one watt operation only. The logic circuits have readily removable circuit blockers for allowing transmission on unassigned channels.

The novel features believed to be characteristic of this invention are set forth in the appended claims. The invention itself, however, as well as other objects and advantages thereof may best be understood by reference to the following detailed description of illustrative embodiments when read in conjunction with the accompanying drawings in which:

FIGS. 6a–6f are schematics of the digital input/output and power supply printed wiring board;

Figure 1:
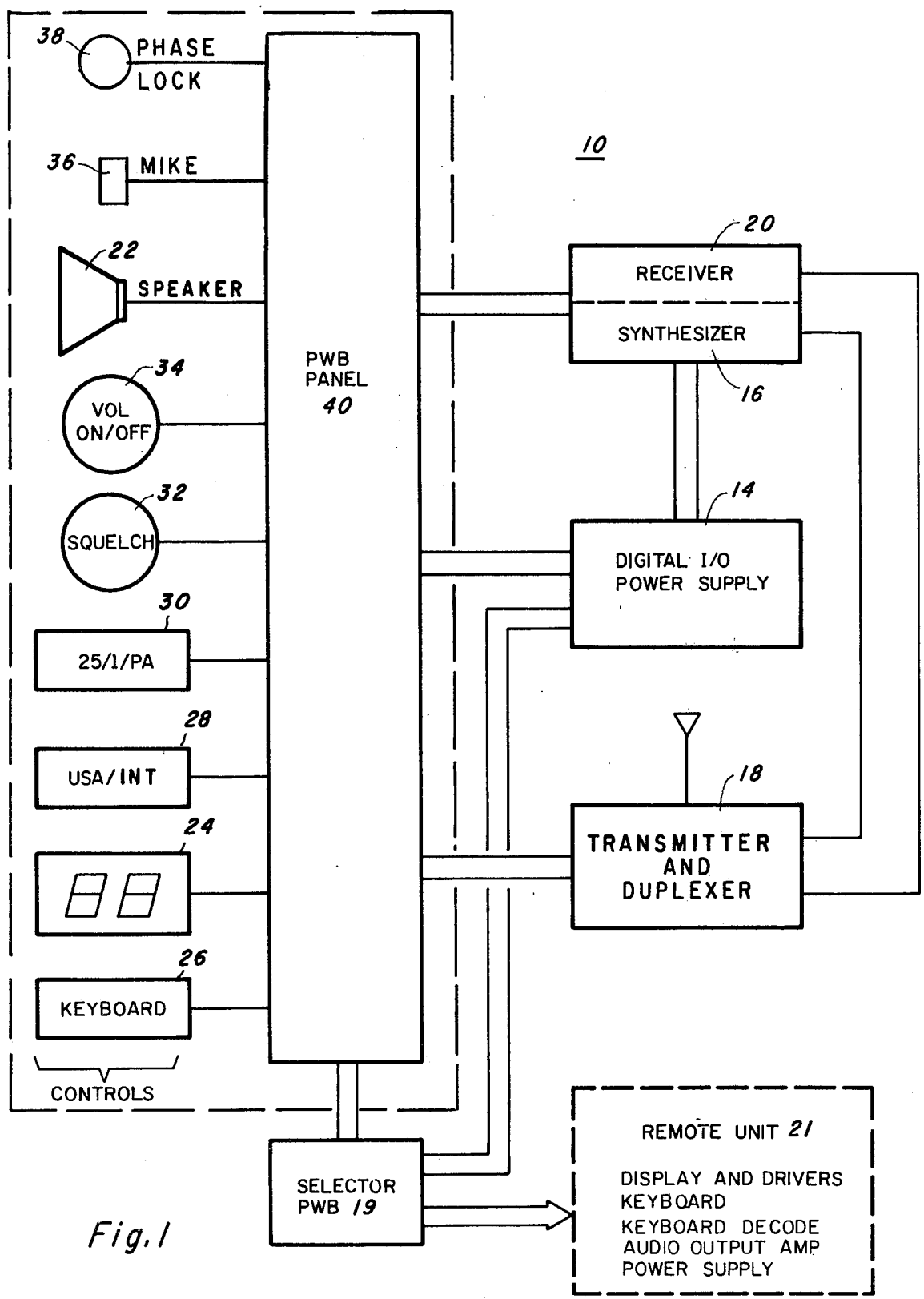
FIG. 1 is a functional block diagram of the radio telephone printed wiring boards and controls.

Referring now to FIG. 1, the radio telephone or transceiver 10 comprises a display, speaker, and control assembly 12, a power supply and digital logic control unit 14, a frequency synthesizer unit 16, a transmitter and duplexer unit 18 and a receiver unit 20. A selector PWB 19 and a remote unit 21 can be attached to permit operation remote to the control assembly 12. The system automatically senses selection of the remote unit for operation.

Figure 2:
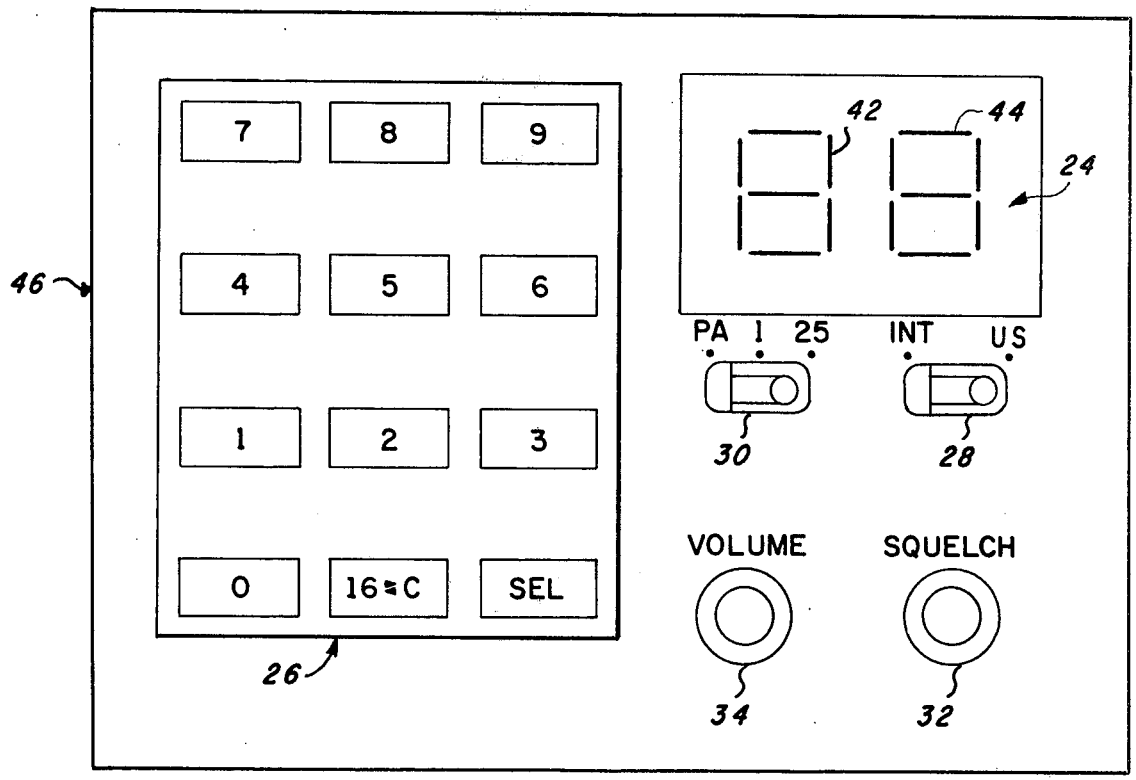
FIG. 2 is a plan view of the radio telephone's front panel.

The speaker, display and control assembly 12 (FIG. 1) includes a speaker 22 and display 24 controlled by a keyboard 26, USA/INT switch 28, 25 W/1 W/ PA switch 30, squelch controller 32, On/Off/Volume switch 34, microphone 36 and phase lock indicator 38 interfacing with the front end of panel printed wiring board 40. The keyboard 26 (FIG. 2) has twelve push button keys which include ten numeric keys, one for each of the numbers 0 through 9, a channel 16 ≦ C key, and a select, "SEL", key. The display 24 comprises a pair of gaseous discharge type display elements 42 and 44 such as, for example, DS 101's manufactured by Beckman Instruments. The US/INT switch 28 and 25 W/1 W/PA switch 30 are toggle switches, and the squelch controller 32 and On/Off/Vol switch 34 are knob type switches. The keyboard 26, display 24, US-/INT and PA toggle switches 28 and 30, and squelch and volume knobs 32 and 34 are arranged in a panel 46; the panel is inserted in a portion of a front end plate, not shown, of a housing for the transceiver unit 10 and the speaker 22 (FIG. 1) is attached to another portion of the front end plate of the unit housing adjacent to the panel 46.

As shown in block diagram in FIG. 1, the digital input/output and power supply printed wiring board 14, synthesizer 16, transmitter 18, receiver 20, and the remote unit selector PWB, when attached, interface with the front panel wiring board 40.

Figure 3:
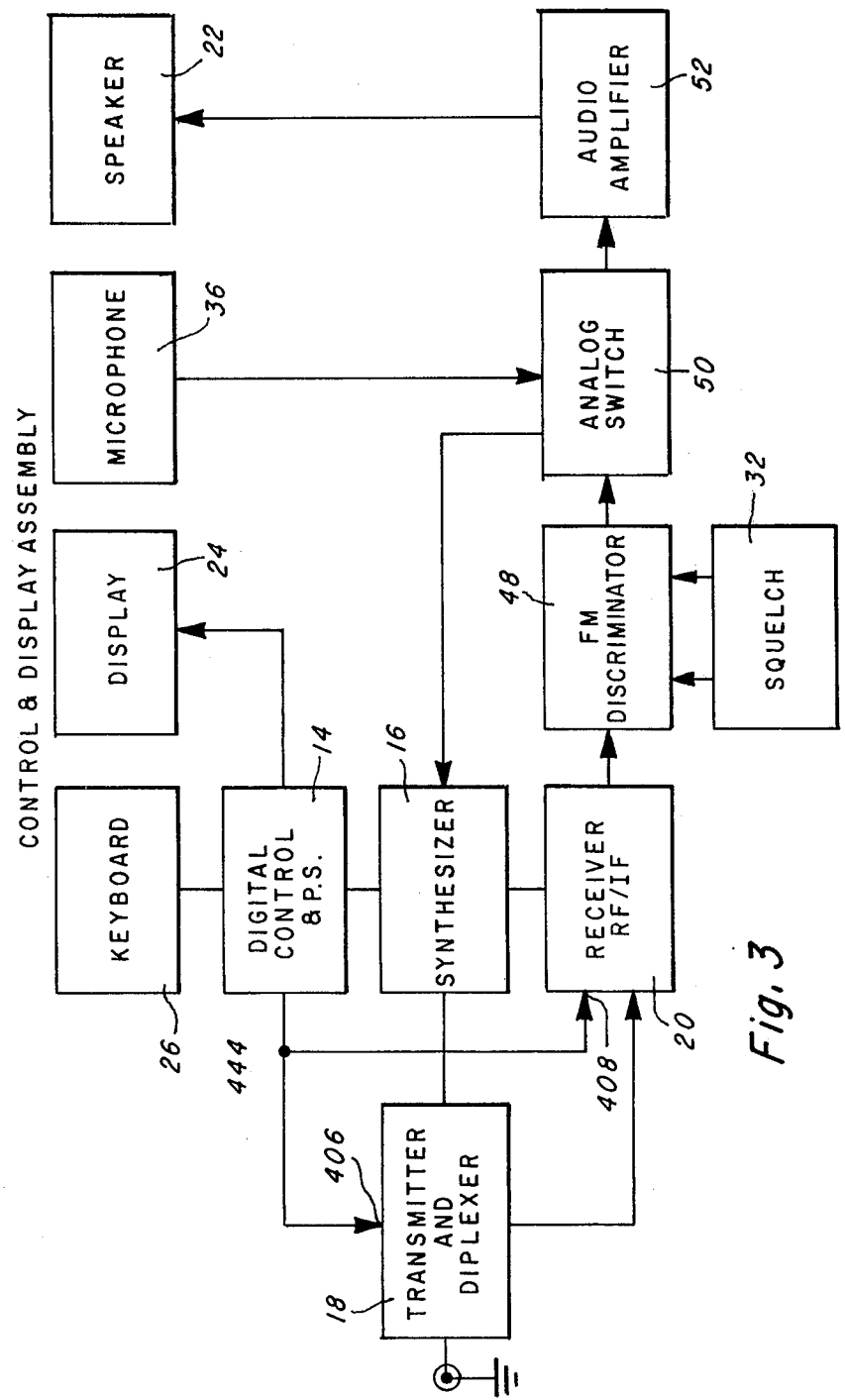
FIG. 3 is a functional block diagram of the radio telephone's components.

Referring now to FIG. 3, the keyboard 26 is electrically coupled to the digital control and power supply printed wiring board 14. The digital controls of the digital input and output control and power supply printed wiring board (Dig. I/O power supply PWB) 14 receives the operators selections and provides digital word instructions to the display 24, and synthesizer 16 of the synthesizer/receiver printed wiring board. The synthesizer in response to the digital control signals synthesizes: either tuning signals for the emergency channel "16" and an operator selected channel for scanning these channels for incoming communications, or selected carrier frequency signals for the transmitter 18 for transmission. The Dig. I/O power supply PWB provides a control signal to the receiver 20 and transmitter 18 to inactivate the receiver during transmission and vice versa. The receiver 20 provides received signals to the FM discriminator 48 whose output is subject to control by the squelch control 32. The output of the discriminator is connected to an analog switch 50. The analog switch 50 directs the microphone input to either the synthesizer for mixing with the transmitter carrier signal or through an audio amplifier 52 to the speaker 22 in response to a push to talk switch or PA selection switch. When either of these switches are not operative, the analog switch passes the receiver output of the discriminator through the audio amplifier 52 to the speaker 22. The electrical connection of these assemblies as well as connection of the speaker, display, and control assembly 12 to the front panel printed wiring board 40 is shown schematically in FIGS. 4a–4b.

FRONT PANEL PRINTED WIRING BOARD

Figure 4A:
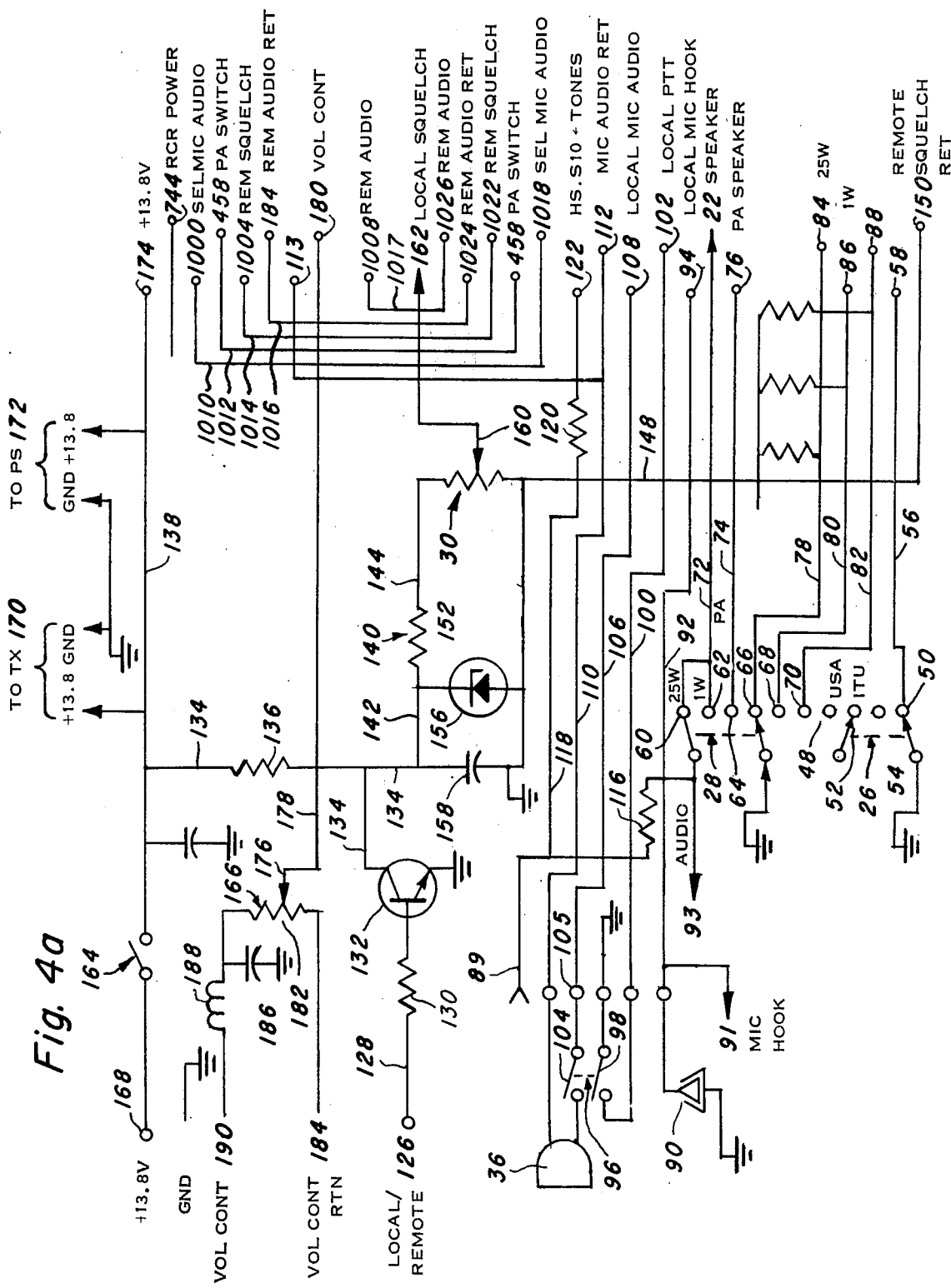
FIG. 4a–4b are schematics of the front panel printed wiring board.

Referring to FIG. 4a, the USA/INT switch 26 has selector contact pairs 50 and 52, and 48 and 54 connected such that when USA selector contact 48 is selected the INT switch contact 52 is open and the unit operates at U.S.A. frequencies. When the INT selector contact 52 is selected, the INT circuit including contact 50 is connected through lead 56 to the USA/INT circuit selector terminal 58 leading to the digital I/O power supply PWB (FIG. 6a) and the unit operates on international frequencies.

The 25 W/1 W/PA switch 28 (FIG. 4a) has output contacts 60, 62 and 64 and selector contacts 66, 68, and 70. Output contacts 60 and 62 connect either the 25 W or 1 W audio through lead 72 to the internal speaker 22 (FIG. 1a), and contact 64 (FIG. 4a) connects either the 25 W or 1 W audio through lead 74 to a PA speaker terminal 76 for a ship's PA speaker not shown. The output contacts 60, 62, and 64 are for selective engagement with selector contacts 66, 68, and 70 which are connected respectively, through leads 78, 80, and 82 to the 25 W, 1 W, and PA select circuit terminals 84, 86, and 88 leading to the digital I/O/power supply PWB (FIG. 6a). A panel printed wiring board 40 plug in terminal 89 (FIG. 4a) is available to connect a handset by lead 118 to the junction of a handset sidetone terminal 122 of the synthesizer of the synthesizer/receiver PWB (FIG. 7), and audio input side 93 (FIG. 8d) of the 25 W/1 W/PA switch 28 (FIG. 4a).

Figure 6B:
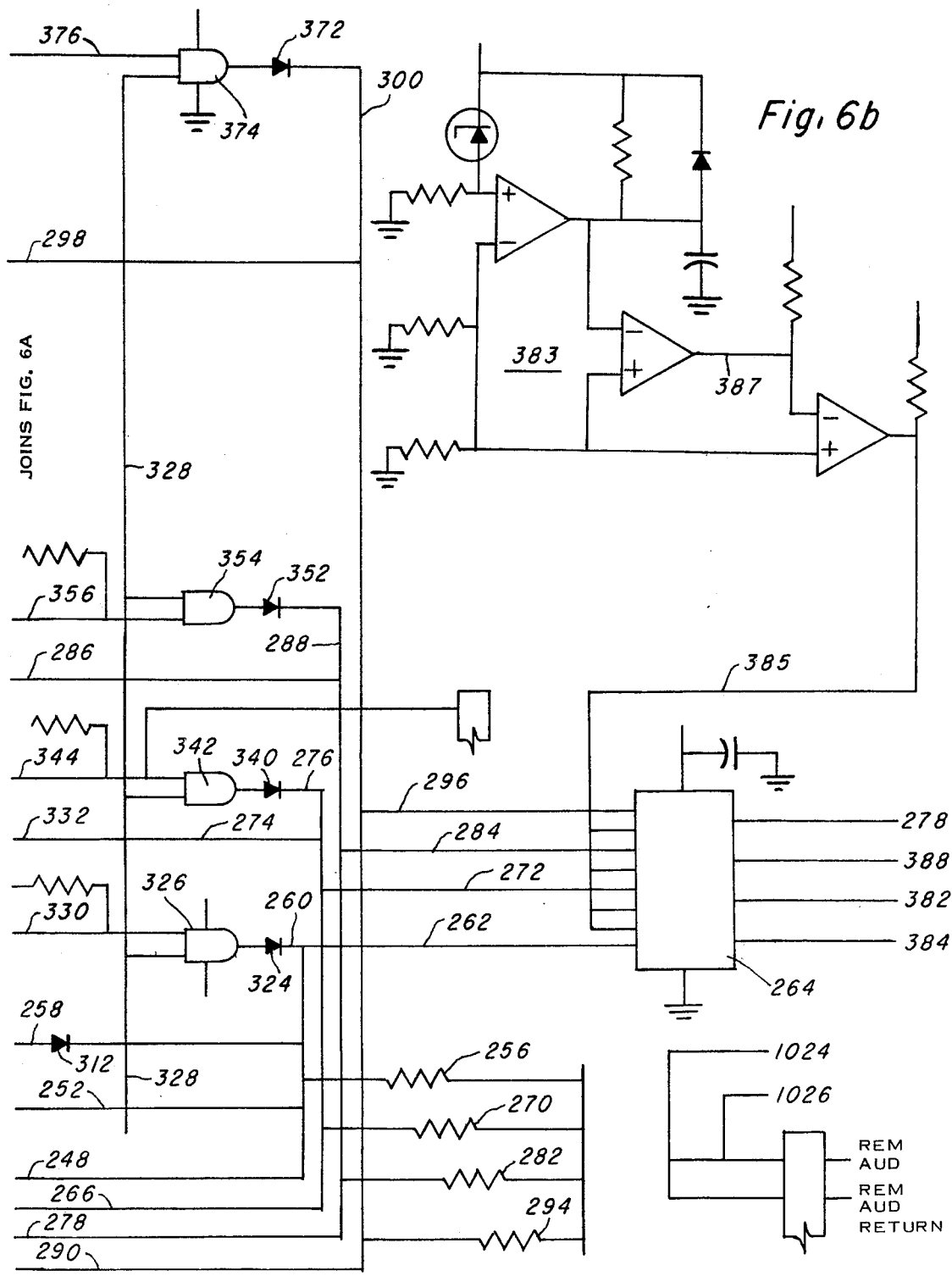
Figure 7:
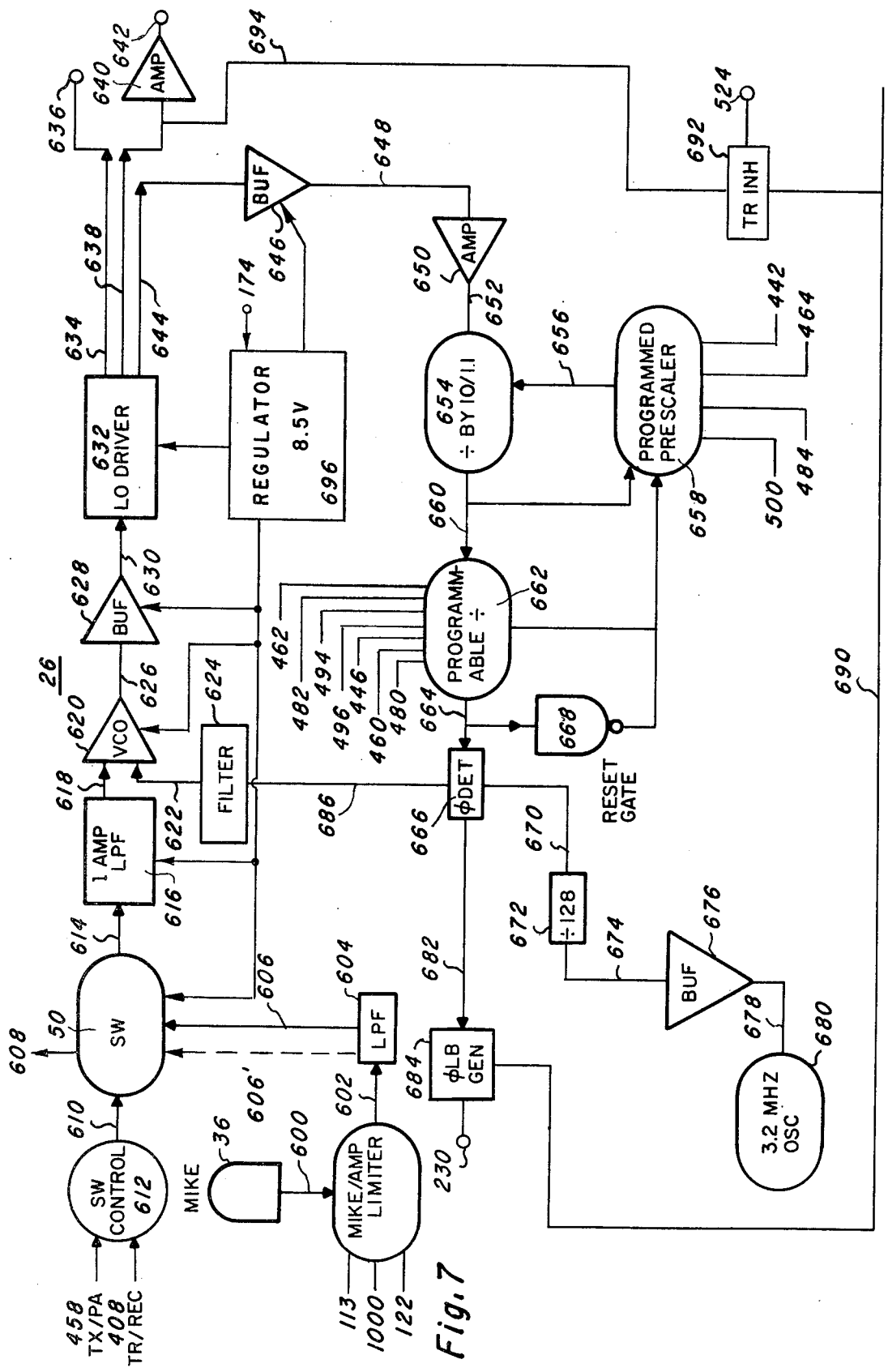
FIG. 7 is a functional block diagram of the synthesizer printed wiring board.

The local mike hook bracket switch 90, which is activated by lifting the microphone from its hook, is connected through lead 92 to the junction of handset cradle switch 91 and local mike hook circuit terminal 94 of the digital I/O power supply PWB 24 (FIG. 6a). The microphone 36 (FIG. 4a) has a double pole push to talk switch 96. One pole 98 is connected through lead 100 to the digital I/O power supply PWB 24 push-to-talk circuit terminal 102 (FIG. 6a) which switches the transceiver from the receiving mode to the transmitting mode. The other pole 104 (FIG. 4a) of the switch 96 is connected to the panel input terminal 105 and through lead 106 to the local mike audio circuit terminal 108 (FIG. 6a) of the receiver synthesizer PWB and digital I/O power supply PWB. The microphone 36 is also connected through lead 110 to microphone audio return terminals 112 and 113 of the digital I/O power supply PWB (FIG. 6a) and synthesizer/receiver PWB (FIG. 7), respectively. The audio circuit input 93 (FIG. 4a) is connected through lead 114 to a resistor 116, the resistor 116 is connected through lead 118 to the junction of handset plug in 89 of the panel PWB and resistor 120. Resistor 120 is connected to the side-tones circuit terminal 122 (FIG. 7).

A local/remote operation switch control terminal 126 (FIG. 4a) leading to the digital I/O power supply PWB (FIG. 6c) is provided to connect a remote control unit to the junction of a source of power circuit and a squelch control circuit 140 as follows:

The terminal 126 (FIG. 4a) is connected through lead 128 to a biasing resistor 130; the biasing resistor 130 is connected to the base of NPN transistor 132 whose emitter is grounded and whose collector is connected by lead 134 to the junction of the power supply dropping resistor 136 and squelch control circuit 140. The power supply circuit resistor 136 is connected to the junction of voltage source on/off switch 164, and transmit, power supply and receiver circuit terminals 170, 172 and 174. The switch 164 has its pole terminal connected to a source of power terminal 168 for connection to a 13.8 v source. The squelch control circuit 140 includes a resistor 142 having its positive end connected to the junction of a zener diode 156, and capacitor 158, and its negative end connected to a potentiometer 30.

Figure 8A:
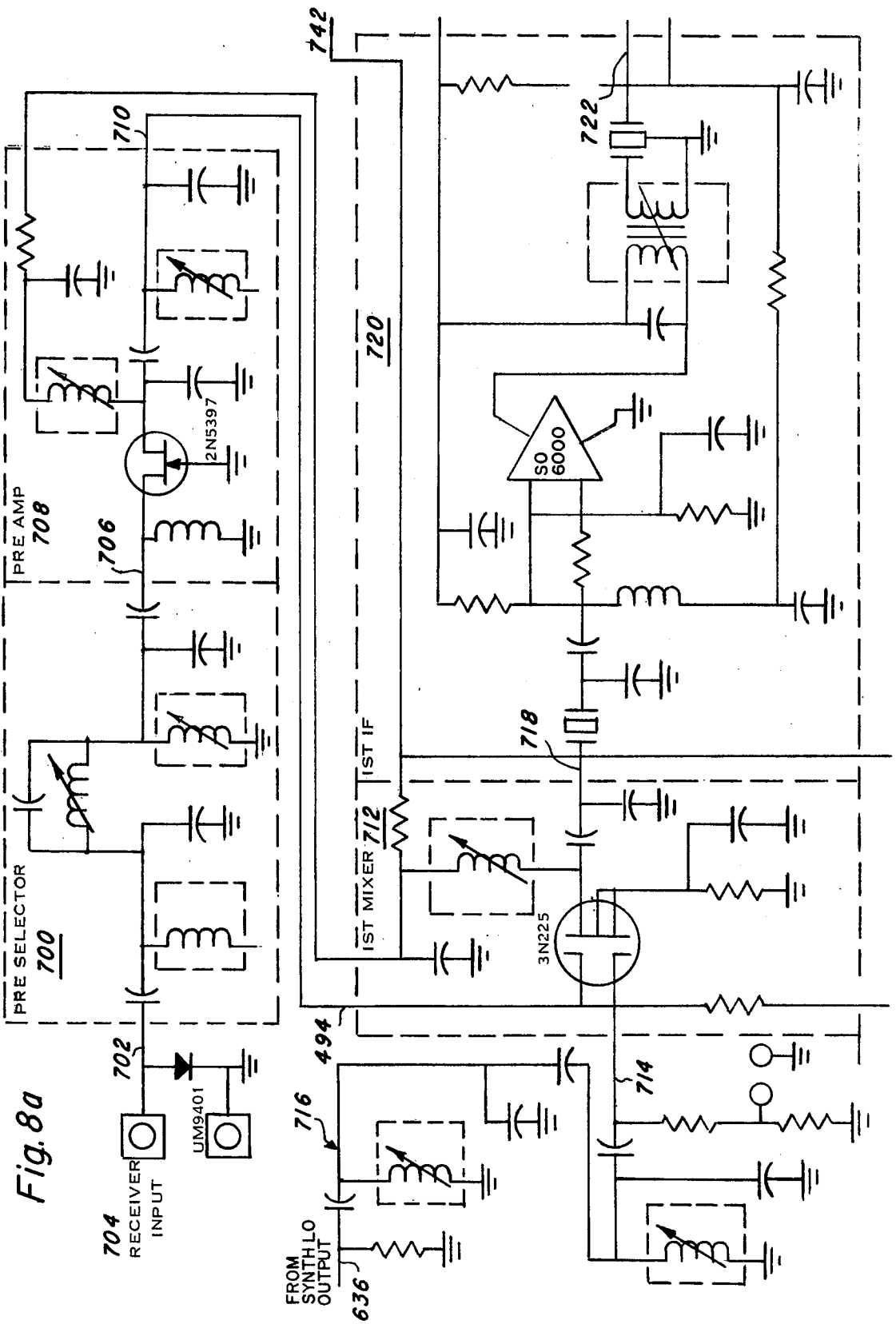
FIGS. 8a–8d are schematics of the receiver printed wiring board.
Figure 8B:
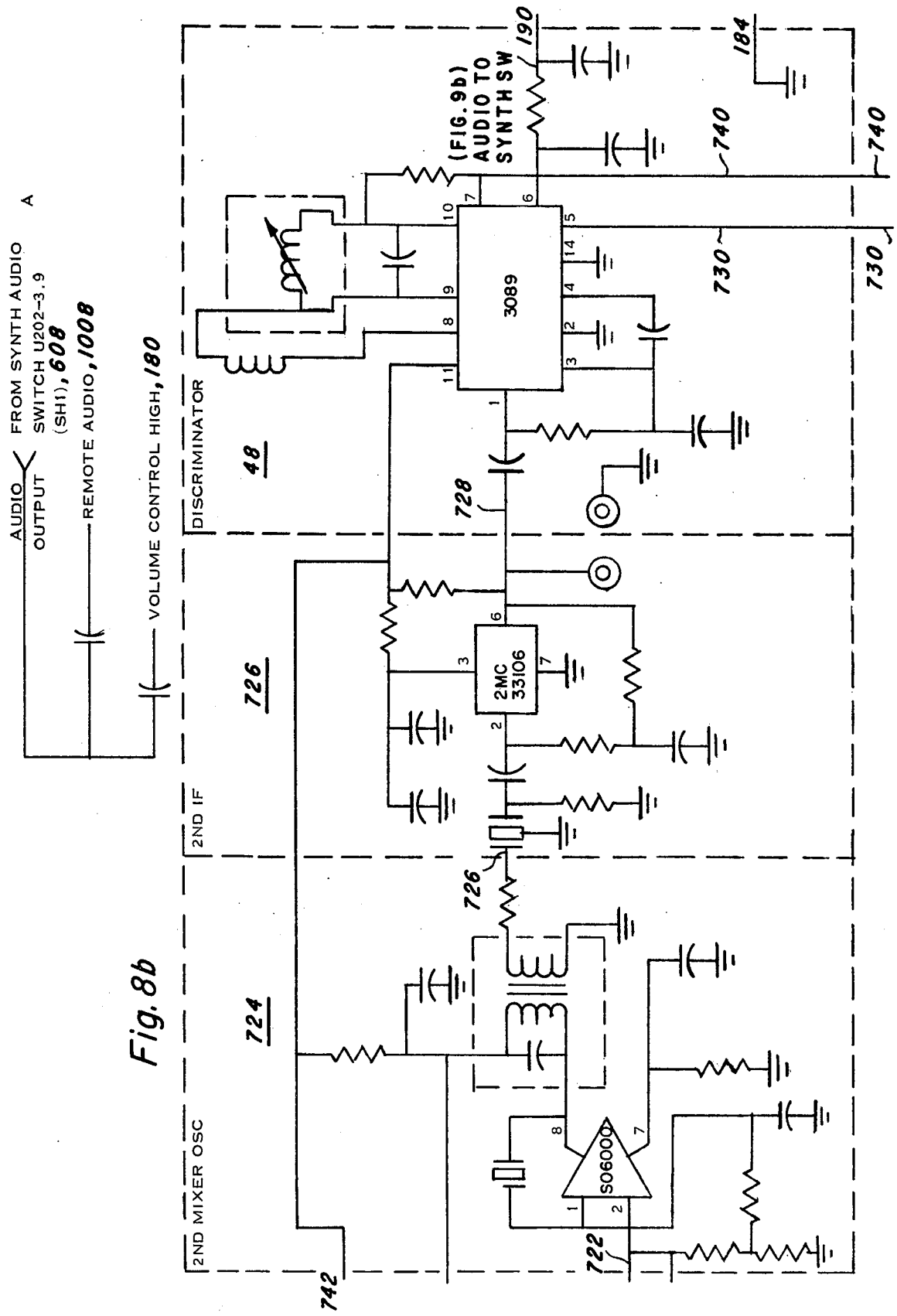
Figure 8C:
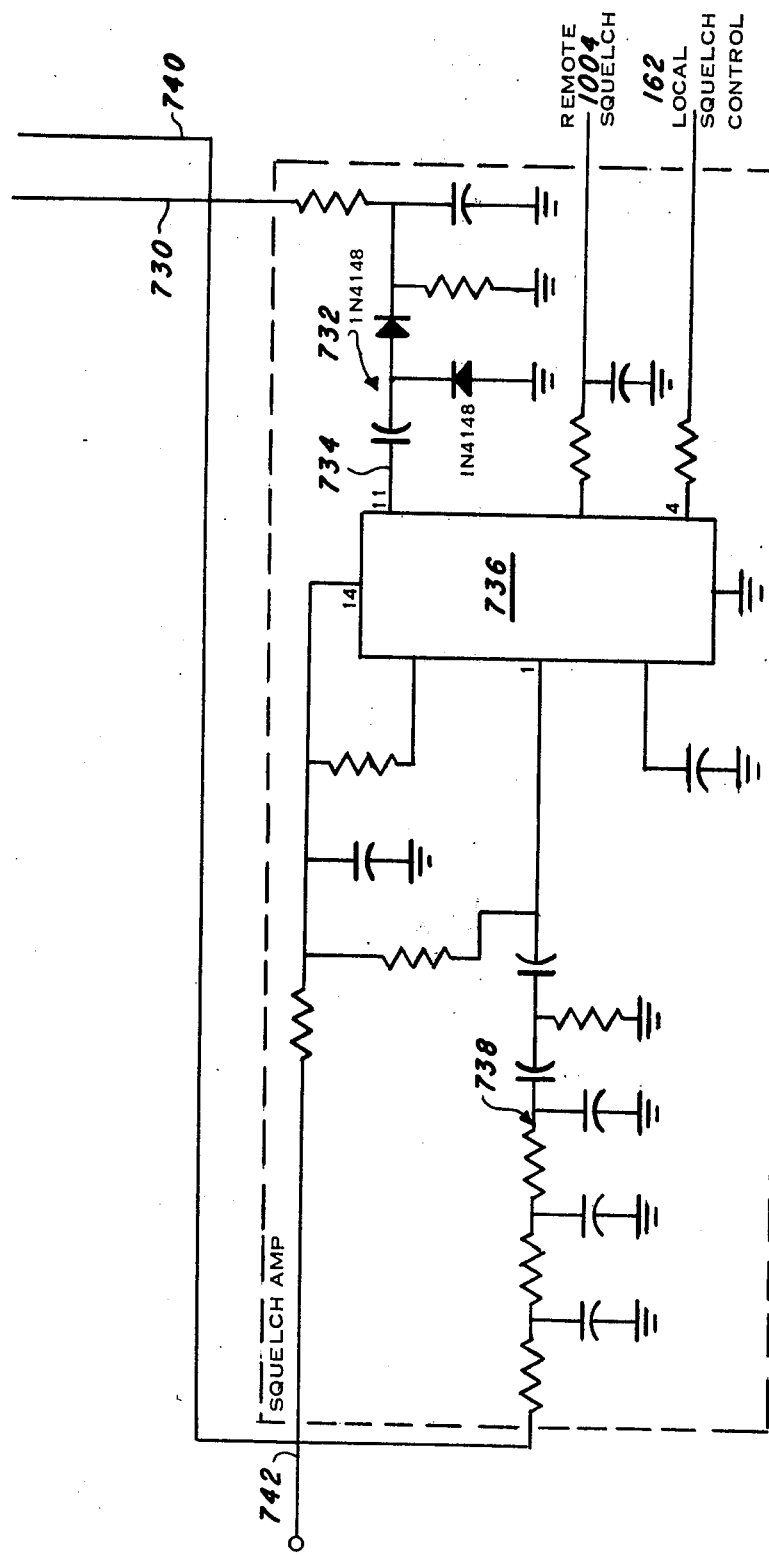

The resistor of the potentiometer is connected by lead 148 to squelch return terminal 150 of the remote unit interface board 19 (FIG. 1). The zener diode 156 and capacitor 158 are connected to ground. The squelch control knob 32 (FIG. 2) is connected to the arm 160 (FIG. 4a) of potentiometer 30, and the arm is electrically connected to the squelch circuit terminal 162 (FIG. 8c).

Figure 8D:
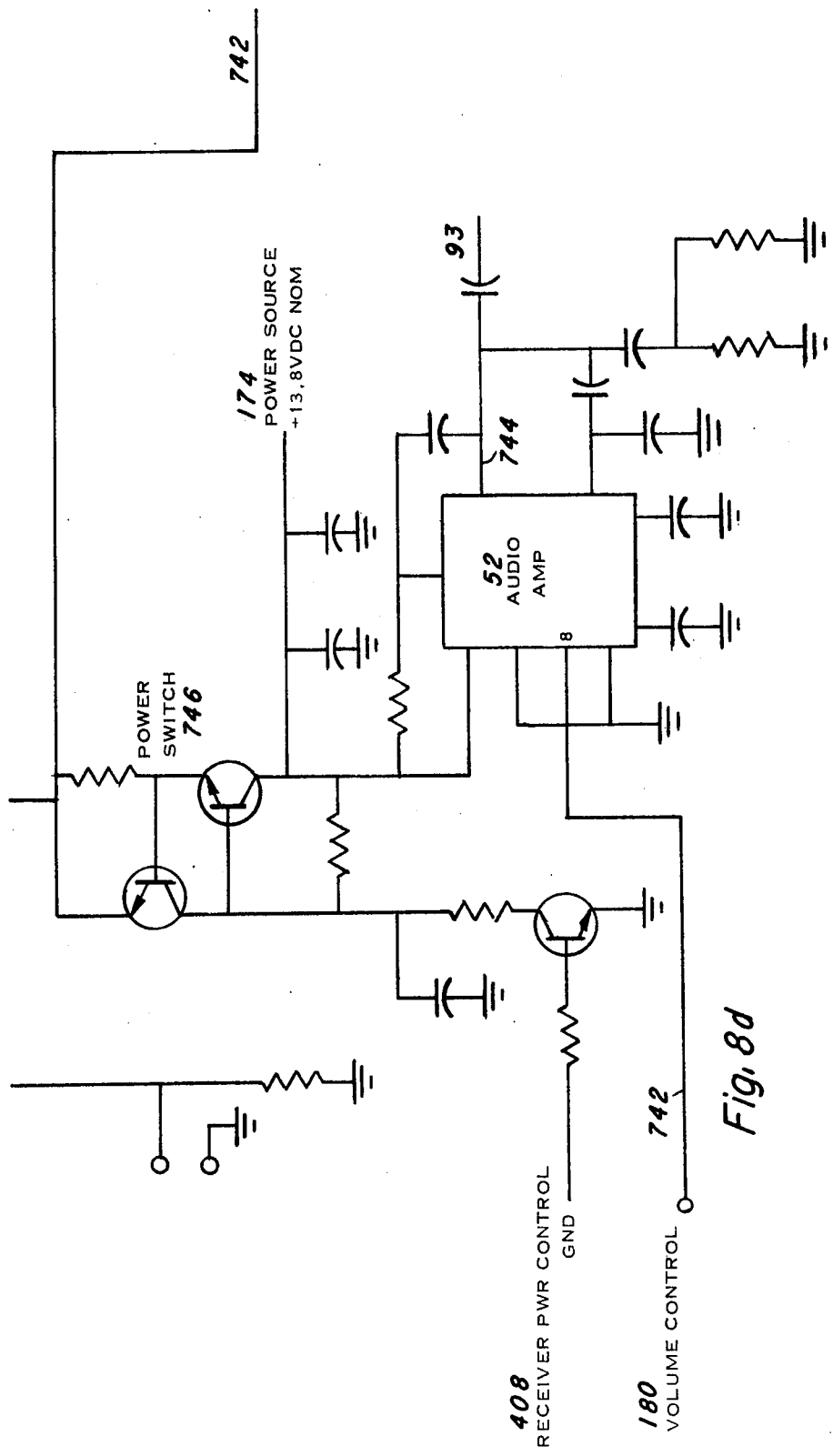

The volume, on/off switch 32 (FIG. 2) comprises a knob attached to the switch 164 (FIG. 4a) in the power line 138 and arm 176 of the potentiometer 166. The arm 176 of potentiometer 166 is connected through lead 178 to the volume control terminal 180 of the receiver's audio amplifier (FIG. 8d). The resistor 182 of the potentiometer 166 has its negative end connected to the volume control return terminal 184 (FIG. 8b) and its positive end connected to the junction of a capacitor 186 connected to ground and inductor 188. The inductor 188 is connected to volume control terminal 190 leading to the receiver's discriminator 48 (FIG. 8b).

For operation by either the main or remote unit it is necessary to provide the front panel with leads and terminals for interfacing the digital I/O power supply PWB with the receiver/synthesizer PWB. Thus, the front panel has a lead 1010 (FIG. 4a) for connecting the select microphone audio terminal 1000 of the synthesizer's mike/amp. limiter 601 (FIG. 7) to the select microphone audio terminal 1018 of the digital I/O power supply PWB (FIG. 6f); a lead 1012 for connecting the PA switch terminal 450 458 of the switch control 612 of the synthesizer (FIG. 7) to PA switch terminal 458 of the digital I/O power supply PWB (FIG. 6a); a lead 1014 for connecting the remote squelch terminal 1004 of the squelch amplifier (FIG. 8c) to the remote squelch terminal 1022 of the digital I/O power supply (FIG. 6f); a lead 1016 for connecting the remote audio terminal 184 (FIG. 8b) to the remote audio return terminal 1008 FIG. 8b of the synthesizer audio switch 50 (FIG. 7) to the remote audio switch terminal 1026 of the digital I/O power supply PWB (FIG. 6b).

DISPLAY

Figure 4B:
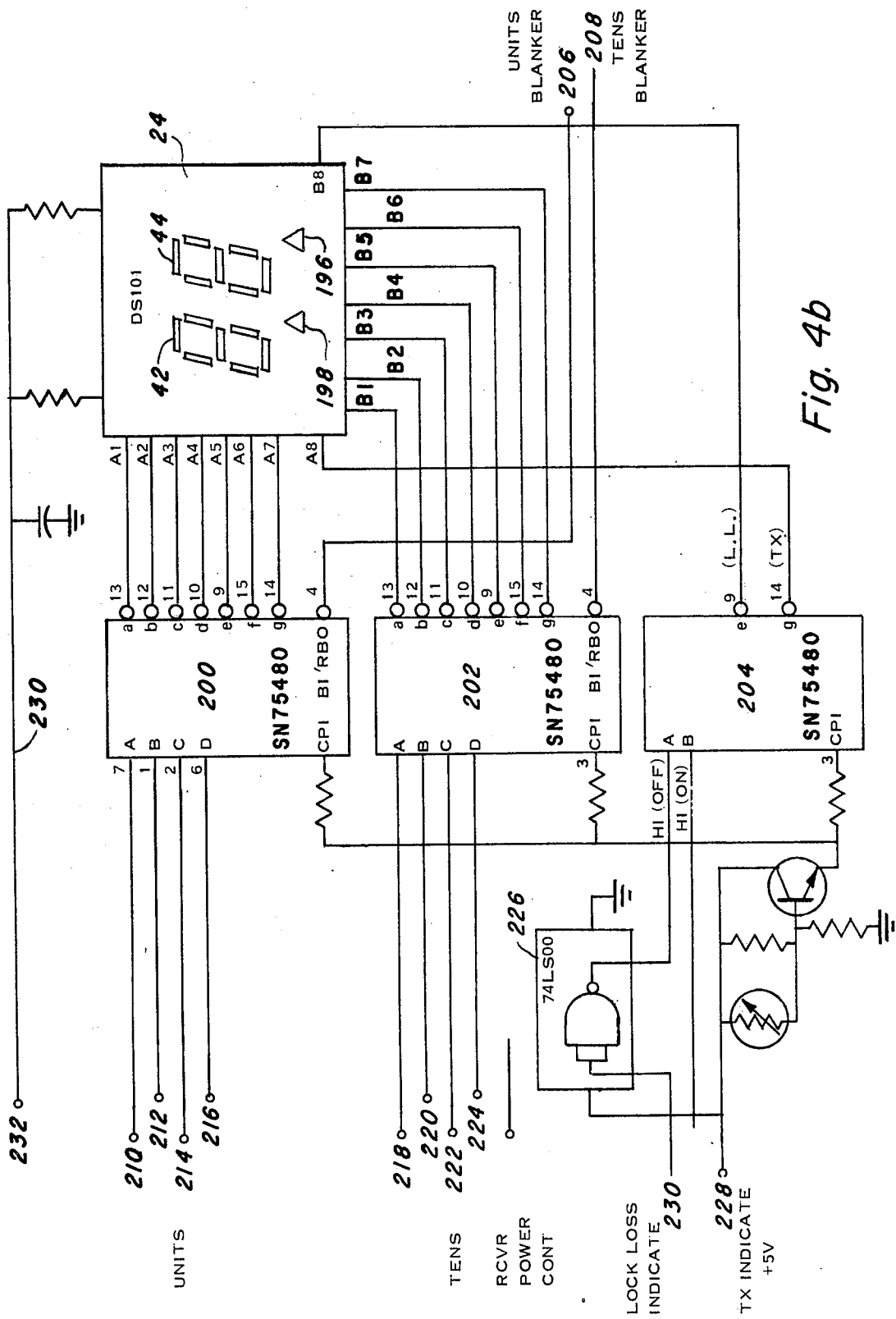
Figure 6D:
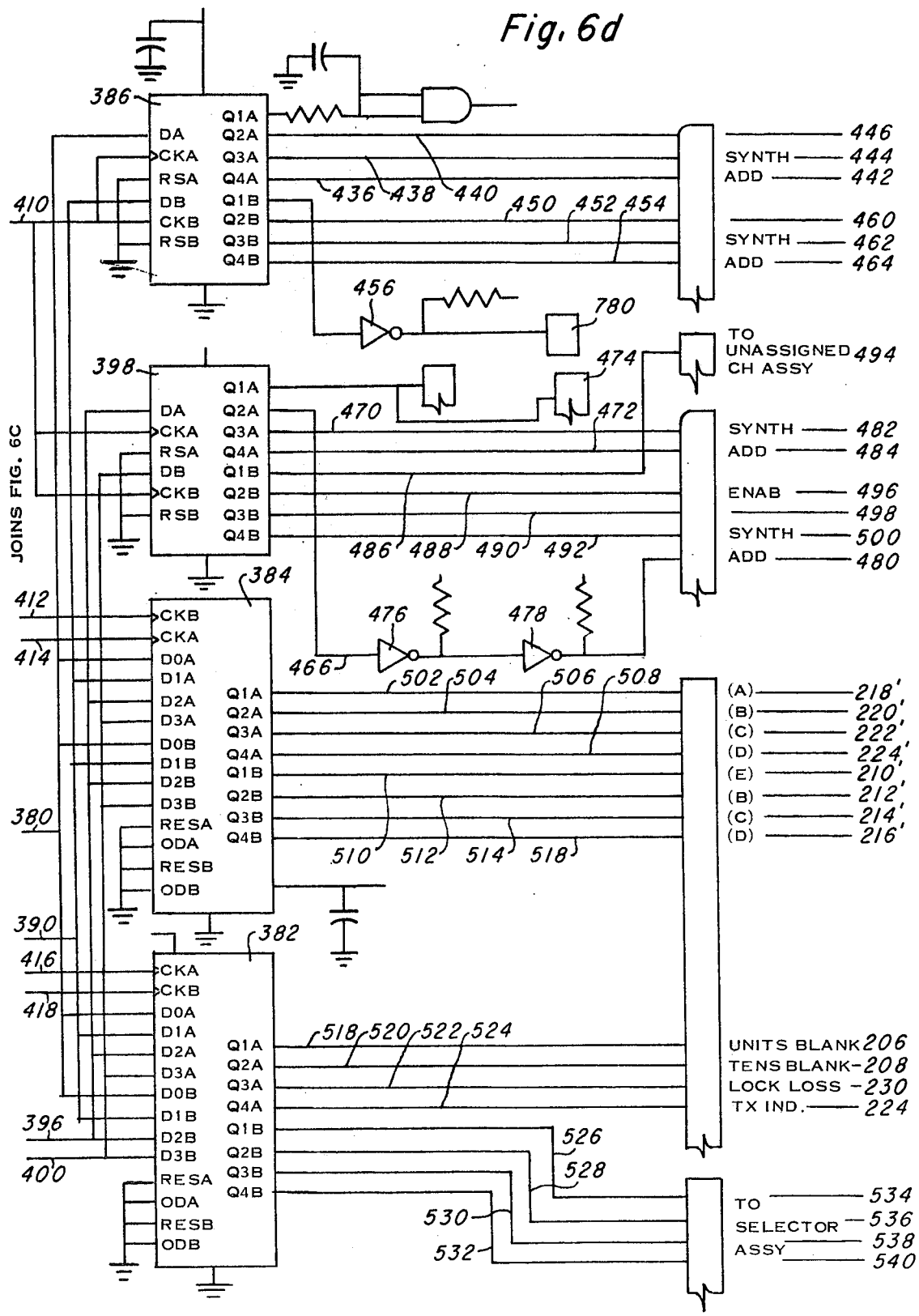

Referring now to FIG. 4b, the display 24 has a units display 44, a tens display 42, a units decimal 196 and a tens decimal 198. The display 42 and 44 are seven segment displays. The segments of the units displays 44 are connected to display terminals A1-A7 which are connected to terminals 9-15 of driver 200, and the segments of the tens display 42 are connected to display terminals B1-B7 which are connected to terminals 9-15 of driver 202. The units and tens decimals 196 and 198 are connected to display terminals A8 and B8 which are connected to terminals 9 and 14 of driver 204. The drivers 200, 202, and 204 are, for example, standard SN75480 drivers. The 4 pins of drivers 200 and 202 are connected respectively, to units blanker circuit terminal 206 and to tens blanker circuit terminal 208 of the digital I/O power supply PWB 14 (FIG. 6d) which cause the displays to flash on and off when an illegal channel is selected. The input terminals A, B, C and D (FIG. 4b) of drivers 200 and 202 are connected, respectively, to unit circuit terminals 210-216 and tens circuit terminals 218-224 of the digital I/O power supply PWB 14 (FIG. 6d). Terminals A and B (FIG. 4b) of driver 204 are connected respectively, to a NAND gate 226 and a transmit indicate circuit terminal 228. NAND gate 226 is connected to a synthesizer lock loss indicate circuit terminal 230 of the digital I/O power supply PWB (FIG. 6d). The lock loss circuit controls the units decimal to flash it on and off to indicate lock loss, and the transmit circuit controls the tens decimal to flash it on and off to indicate when a receive only channel has been selected. Power is supplied the display 24 (FIG. 4b) through lead 230 and terminal 232 of the power supply (FIG. 6f).

KEYBOARD SCHEMATIC

Figure 5:
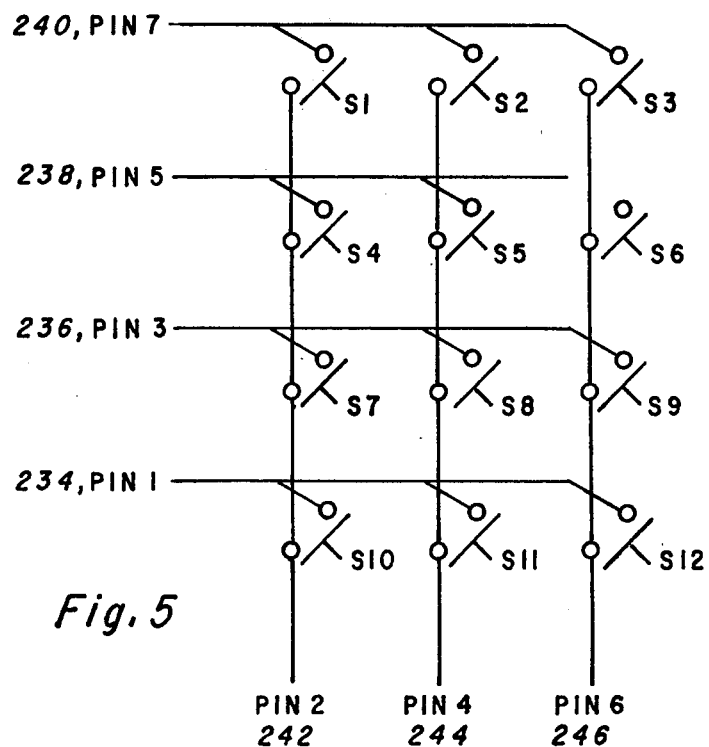
FIG. 5 is a schematic of the radio telephone's keyboard circuit.

Referring now to FIG. 5 which shows schematically the keyboard 26 (FIG. 2), the keys 0-9, 16 ⸮ C, and SEL (select) are shown as switches S1-S12. The switches S1-S12 are arranged in rows and columns, four rows 234, 236, 238 and 240 of three switches each, and three columns 242, 244, and 246 of four switches each. The columns 242, 244, and 246 are multiplexed by outputs (pins 2, 14, and 3) of a multiplexer 318 (FIG. 6c) to determine in sequence the pressed keys. The outputs of rows 234, 236, 238 and 240 (FIG. 5) are connected to corresponding terminals 234, 236, 238 and 240 (FIG. 6a) leading to an encoder (driver) 264 (FIG. 6b) and from driver 264 to terminals 5 through 9 378, 388, 382 and 384, of a microprocessor 306 (FIG. 6c) of the digital input/output, power supply printed wiring board 14 (FIG. 6a). The microprocessor (FIG. 6c) scans the rows for depressed keys.

DIGITAL INPUT/OUTPUT PWB

Terminals 234, 236, 238 and 240 corresponding with the keyboard terminals of the same numbers (FIG. 5) are connected as follows:

Terminal 234 (FIG. 6a) is connected by lead 248 through diode 250 to the junction of lead 252 (FIGS. 6a & 6b) of the remote clock line 254, bleeding resistor 256 to ground, lead 258 of the phase lock circuit, lead 260 of the USA/INT select circuit, and lead 262 to pin 13 of enoder 264;

Terminal 236 (FIG. 6a) is connected by lead 266 through diode 268 to the junction of bleeder resistor 270 to ground (FIG. 6b), lead 272 to pin 8 of encoder 264, lead 274 of the squelch circuit, and lead 276 of the push-to-talk circuit;

Terminal 238 (FIG. 6a) is connected by lead 278 through diode 280 to the junction of bleeding resistor 282 (FIG. 6b), lead 284 to pin 6 of encoder 264, lead 286 to the remote acknowledge circuit, and lead 288 to the 1 W select circuit; and Terminal 240 (FIG. 6a) by lead 290 through diode 292 to the junction of bleeding resistor 294 (FIG. 6b), lead 296 to pin 1 of encoder 264, lead 298 to the remote presence sensor circuit, and lead 300 to local PA circuit.

Lead 252 (FIGS. 6b & 6a) of the remote clock line is connected to the junctions of diodes 302 and 304 (FIG. 6a) and the remote data terminal 254 (FIG. 6a). Diodes 302 and 304 are connected by leads 308 and 310 to enabling output pins 11 and 12 of microprocessor 306 (FIG. 6c).

Lead 258 (FIG. 6b) of the phase lock loss circuit is connected through diode 312 to the output of AND gate 314 (FIG. 6a). Gate 314 has a first input terminal (Pin 2) connected through lead 316 to pin 1 of multiplexer 318 (FIG. 6c), and second input terminal (pin 1) (FIG. 6a) connected through inverters 320 and 322 connected in series to phase lock loss terminal 521 of the receiver/synthesizer PWB (FIG. 7).

Lead 260 (FIG. 6b) of the USA/INT select circuit is connected through diode 324 to the output of AND gate 326. AND gate 326 has a first input terminal (Pin 2)

connected through lead 328 to pin 15 of multiplexer 318 (FIG. 6c), and a second input terminal (pin 1) (FIG. 6a) connected by lead 330 to the USA/INT select terminal 58 (FIG. 4a).

Lead 274 (FIG. 6b) is connected to the junction of diodes 332, and 333 (FIG. 6a) and the data terminal 354 (FIG. 6a) of the remote unit PWB (FIG. 1). Diodes 332 and 333 are connected respectively at terminal 308 to pin 11 of the microprocessor 306 (FIG. 6c), and to the output terminal of AND gate 336 (FIG. 6a). AND gate 336 has a first input terminal 5 connected through lead 316 to pin 1 of multiplexer 318 (FIG. 6c), and a second input terminal (pin 6) (FIG. 6a) connected to the output of comparator 338 having its positive terminal connected to a reference voltage and its negative terminal connected to the squelch terminal 162 of the receiver/-synthesizer PWB (FIG. 8c).

Lead 276 (FIG. 6b) of the push-to-talk circuit is connected through diode 340 to the output terminal of AND gate 342. AND gate 342 has a first input terminal (pin 5) connected through lead 328 to pin 15 of multiplexer 318 (FIG. 6c) and a second input terminal (pin 6) (FIG. 6a) connected through lead 344 to the push-to-talk terminal 102 (FIG. 6a and 4a). Lead 286 (FIGS. 6a & 6b) is connected to the junction of diodes 346 and 348 and remote acknowledge terminal 331 of the remote unit PWB. The diodes 346 and 348 are connected, respectively by leads 308 and 310 to pins 11 and 12 of microprocessor 306 (FIG. 6c).

Lead 288 of the 1 W/25 W power select circuit (FIG. 6b) is connected through diode 352 to the output terminal of AND gate 354. AND gate 354 has a first input terminal (pin 9) connected through lead 328 to the junction of pin 15 of multiplexer 318 (FIG. 6c), and a second input terminal (pin 8) connected through lead 356 to the junction of diode 358 and the 1 W power select terminal 86 (FIG. 4a). Diode 358 (FIG. 6a) is connected to the junction of an inverter 360 and the 25 W power select terminal 84 (FIG. 4a). The inverter 360 (FIG. 6a) has its output connected to terminal 458 of the switch control 612 (FIG. 7).

Lead 298 (FIG. 6b) of the microphone hook circuit is connected to the junction of diodes 362 and 364 (FIG. 6a), the remote request terminal 366 of the remote unit PWB, and (FIG. 1) the remote control presence sensor circuit 367 also of the remote unit PWB (FIG. 1). Diode 362 (FIG. 6b) is connected to the output terminal of AND gate 368. AND gate 368 has a first input terminal (pin 12) connected through lead 316 to pin 1 of the multiplexer 318 (FIG. 6c), and a second input terminal (pin 13) (FIG. 6a) connected through an RC filter 370 to the microphone hook terminal 94 (FIG. 4a). Diode 364 is connected to lead 308 to pin 11 of the microprocessor 306 (FIG. 6c).

Finally, lead 300 (FIG. 6b) of the public address circuit is connected through diode 372 to the output of AND gate 374. AND gate 374 has a first input terminal (pin 12) connected by lead 328 to pin 15 of multiplexer 318 (FIG. 6c) and a second input terminal (pin 13) (FIG. 6b) connected by lead 376 to the public address terminal 88 (FIG. 4a).

It will be appreciated that the diodes 250, 268, 280, 292, 324, 340, 352 and 372 of the keyboard circuits are used as isolation diodes in a strobed matrix input to the microcomputer 306. The diodes 302, 304, 332, 346, and 348 are controller diodes protecting the Coast Guard auxiliary channels from unauthorized transmittal use. The diodes are readily inactivated when the system is sold to persons authorized to transmit on the Coast Guard authorized channels. Further, gates 314, 336 and 368 (FIG. 6a) may be, for example, those of a CD4081 quad AND gate. These gates have first input terminals connected, respectively, to phase lock, squelch, and mike hook, and second input terminals connected to terminal 1 of the BCD to decimal decoder 318. Gates 326, 342, 354, and 374, (FIG. 6b) may be, for example, those of a CD4081 Quad AND gate. These gates have first terminals connected, respectively, to USA/INT, push-to-talk 25 W/1 W and public address, and second terminals connected to terminals 15 of BCD to decimal decoder 318. All the gates operate, when the "0" outputs of the microcomputer 306 (FIG. 6c) are applied to the BCD to decimal decoder 318 to make either pin 1 or 15 to go high with the other output going low, to load the data present on the AND gates associated with this "high" input into the "K" inputs of the microcomputer 306 through leads 378, 388, 382, and 384 of the driver 264 (FIG. 6b). Upon turn on of the system, the outputs of driver 264 are locked out of the microcomputer for about 10-15 msecs. for initialization of the microcomputer. The delay circuit 383 is that shown in FIG. 6b connected to pins 2, 5, 9, and 12 of driver 264 by lead 385 and to terminal 387 to pin 9 of the microcomputer 306 (FIG. 6c). Next the BCD to decimal decoder 318 will switch states on pin 1 or 15 and the remaining control outputs will load through leads 378, 382, 384 and 388 into the "K" inputs. In this manner, the microcomputer 306 (FIG. 6c) receives the digital inputs from the front panel switches, keyboard and the push-to-talk switch and, in turn, provides the outputs necessary to address the display, receiver, synthesizer and transmitter.

The microcomputer 306 (FIG. 6c) is, for example, a TMS 1100 microcomputer, i.e. it has a 300 KHz internal clock (pins 18-19), and an on chip ROM and RAM along with processing capability which makes it a custom processor. The "K" terminals are the input terminals, the "O" terminals comprise parallel data output terminals and the "R" terminals clock the shift registers and latches and control the option boards, receiver, and transmitter. The inputs to the controller of the microcomputer are categorized as follows: the keyboard entry push buttons which includes the digits 0-9, the 16/c, and select (SEL); the status switches which include the USA/INT, PA/1 W/25 W, microphone hook, push to talk, remote presence, U.S. Government (Coast Guard Auxiliary) channels, and heirarchy (main or remote); information which includes squelch, phase lock, unassigned, unassigned-receive only; and communications which includes REQuest, ACKknowledge; DATa, and CKT.

Figure 6E:
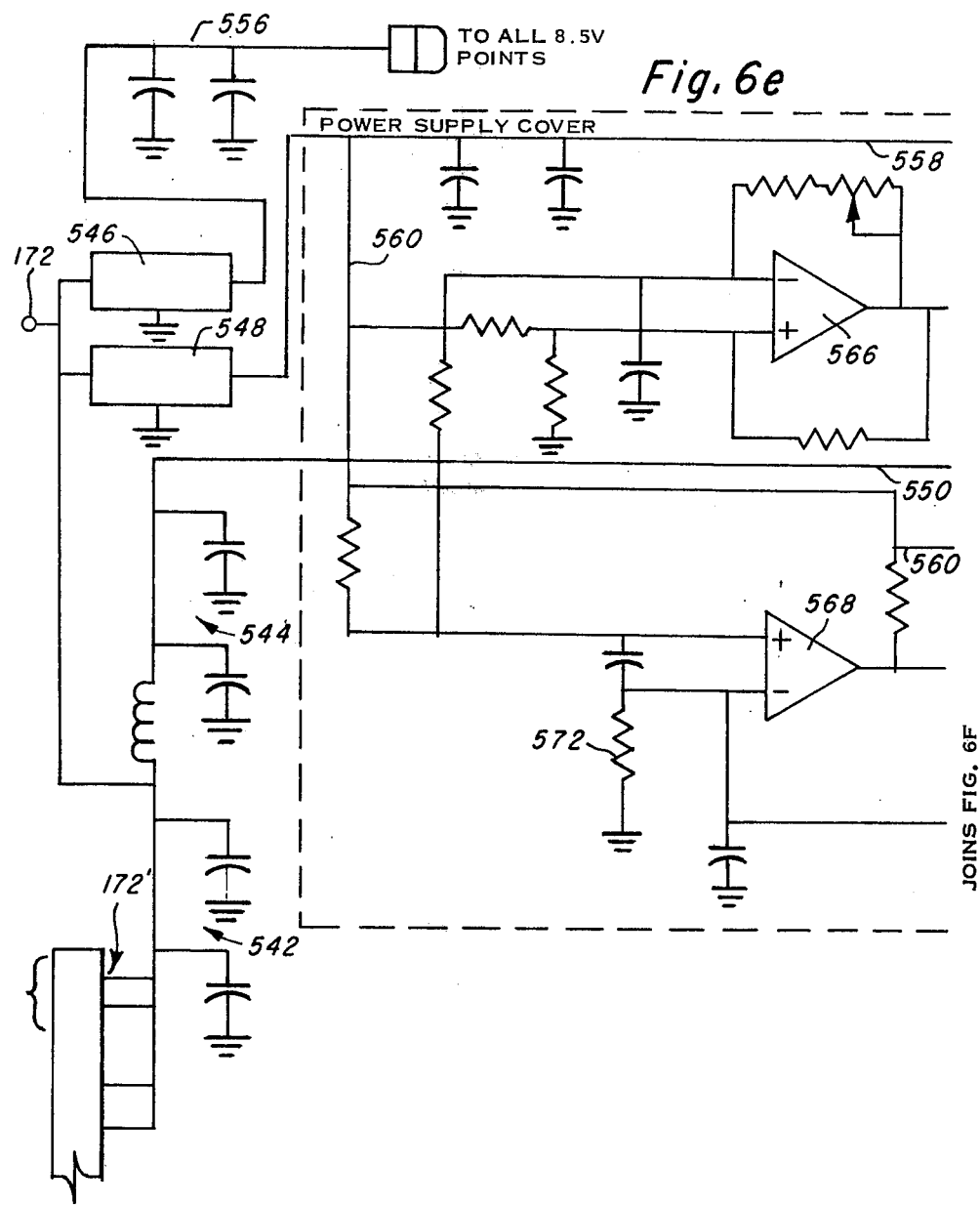
Figure 6F:
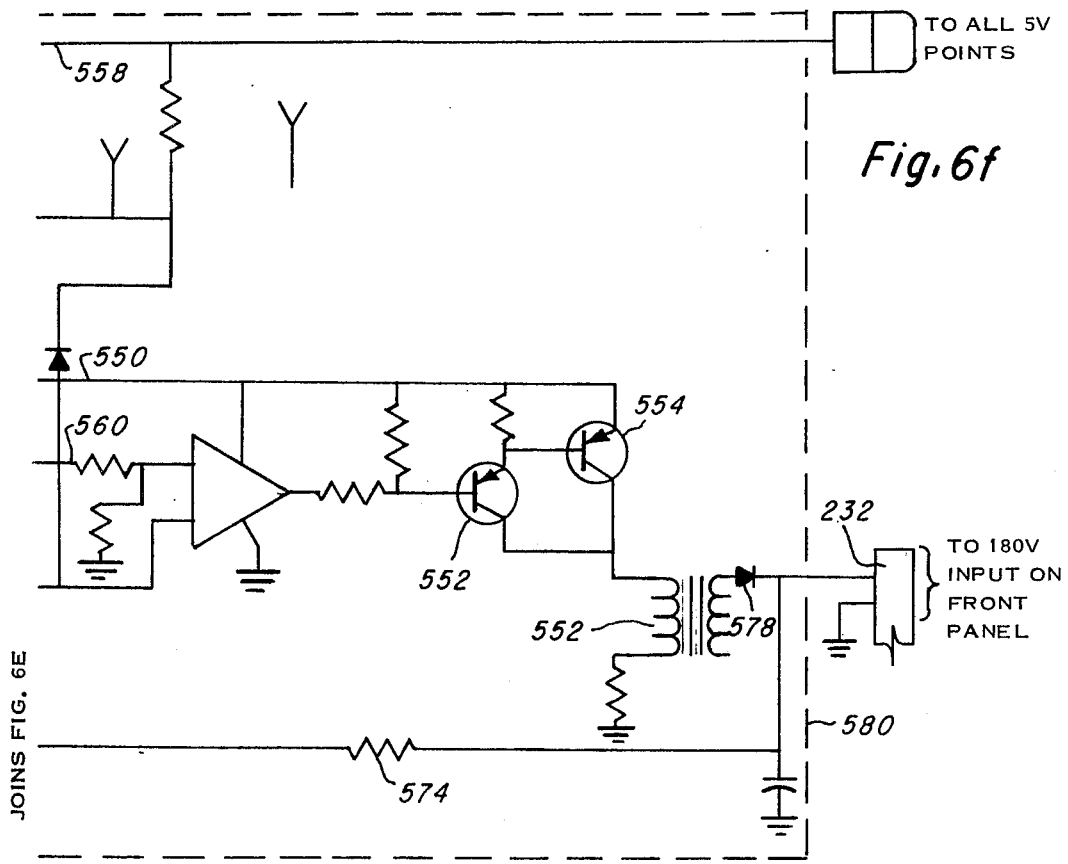
Figure 6F:
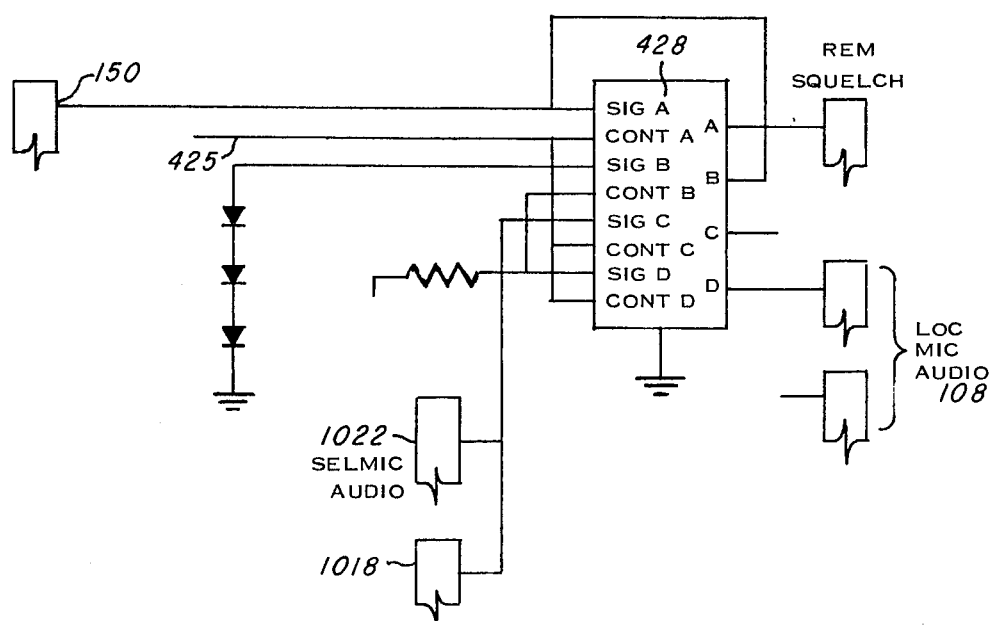
Figure 6G:
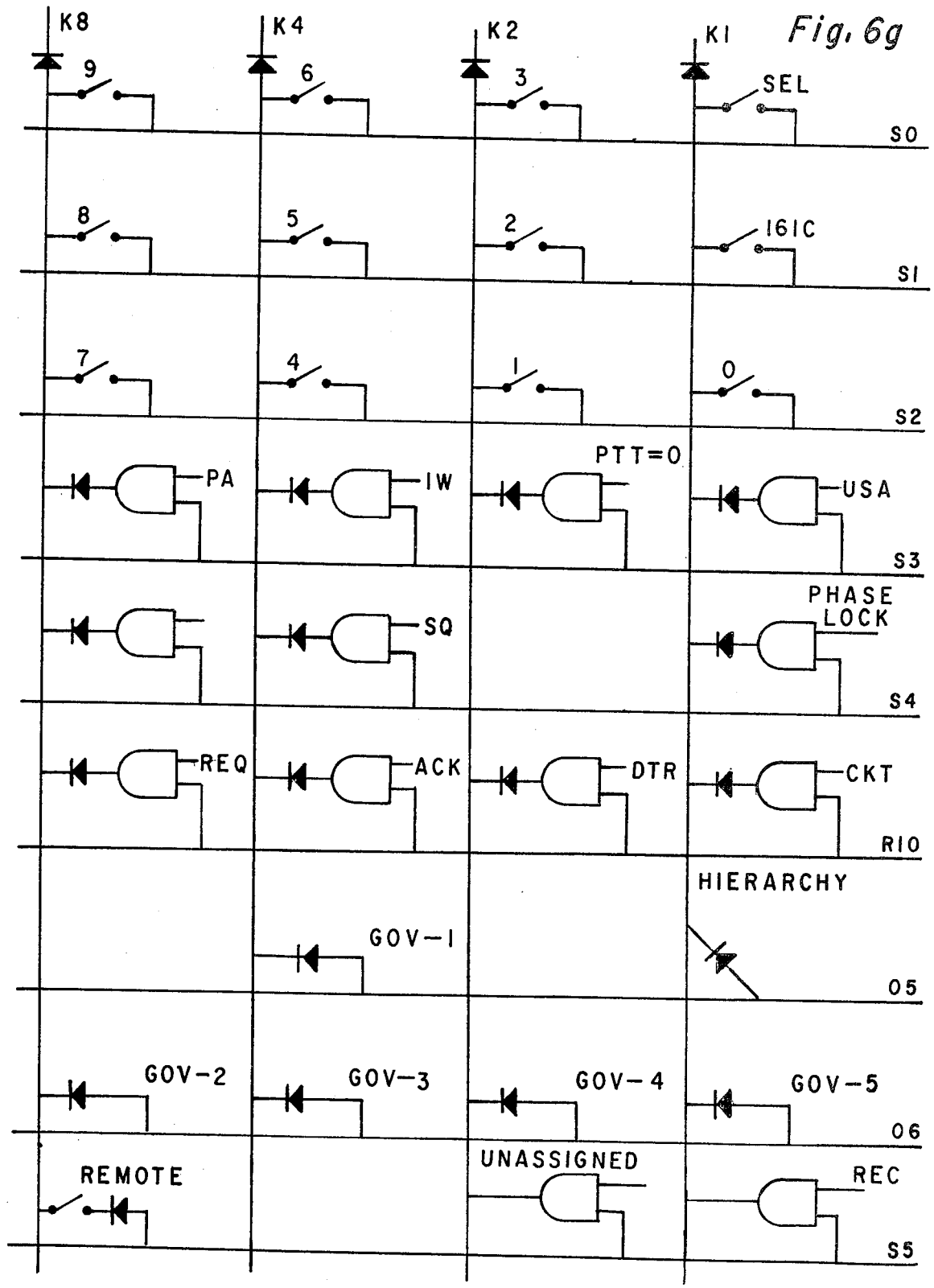
FIG. 6g shows the microcomputer's controller operations in matrix form.

The controller inputs to the microcomputer 306 (FIG. 6a) can be conveniently pictured as 4×9 matrix (FIG. 6g). Some of the positions on the matrix are physically represented by switches and others by input logic lines from various modules in the transceiver. The inputs are through the microcomputer's "K" terminals. Thus, the columns are labeled K1, K2, K4 and K8 and the rows the multiplexer lines. In this manner, any particular position can be "addressed" by the controller setting one of the multiplexer lines incoming to the matrix to a high logic level. This selects a row of the matrix and the controller then reads the "K" inputs to determine which are at a high logic level. In this manner, K1 monitors the keyboard keys Sel, 16c, and O, the USA/INT gate 326, PHASE LOCK GATE 314, clock, heirachy 367, Government (Coast Guard) channel "83", and receive mode. K2 monitors keyboard keys 3, 2 and 1, push-to-talk gate 342, Data gate, Government channel "82", and unassigned gate. K4 monitors keyboard keys 6, 5 and 4, 1 W gate 354, squelch gate 336, acknowledge gate, and Government channels "21" and "81". While K8 monitors keyboard keys 9, 8, and 7, PA gate 374, mike hook (off-high, on-low), request for data, Government channel "23", and remote mode indicating switch.

The microcomputer "O" terminals (FIG. 6c), other than $O_5$ & $O_6$ (pins 12 & 11) previously described are connected as follows:

Terminal $O_o$ (pin 17) (FIG. 6c) is connected by lead 376 to the junction of leads 378 and 380, lead 378 is connected to terminal 10 of BCD to decimal decoder 318, and lead 380 is connected to terminals 4 and 16 of dual latches 382 and 384 (FIG. 6d) and pin 7 of shift register 386; terminal $O_1$ (pin 16) (FIG. 6c) is connected by lead 386 to the junction of leads 388 and 390; lead 388 is connected to pin 13 of the decoder 318, an lead 390 is connected to terminals 6 and 18 of dual latches 382 and 384, and pin 15 of register 386 (FIG. 6d); terminal $O_2$ (pin 15) (FIG. 6c) is connected by lead 392 to the junction of leads 394 and 396, lead 394 is connected to pin 12 of the decoder 318, and lead 396 to terminals 8 and 20 of dual latches 382 and 384 (FIG. 6d) and pin 7 of register 398; terminal $O_3$ (FIG. 6c) is connected by lead 400 to terminals 22 and 10 of dual latches 382 and 384 (FIG. 6d), and pin 15 of register 398; terminal $O_4$ (FIG. 6c) is connected by lead 402 to terminal 11 of the encoder 318. The computer "R" terminals are connected as follows:

Terminal $R_o$ is connected by lead 404 to the junction of transmitter assembly terminal 406 (FIG. 3) and receiver power switch terminal 408 (FIG. 8d); terminal $R_1$ (FIG. 6c) is connected by lead 410 to clock A & B terminals (pins 1 & 9) of registers 386 and 398 (FIG. 6d); $R_2$ (FIG. 6c) is connected by lead 412 to clock B terminal (pin 14) of dual latches 384 (FIG. 6d); terminal $R_3$ (FIG. 6c) is connected by lead 414 to clock A terminal (pin 2) of dual latches 384 (FIG. 6d); terminal $R_4$ (FIG. 6c) is connected by lead 416 to clock A terminal (pin 2) of dual latches 382 (FIG. 6d); terminal $R_5$ (FIG. 6c) is connected by lead 418 to clock B terminal (pin 14) or dual latches 382 (FIG. 6d); terminal $R_6$ (FIG. 6c) is connected by lead 420 through resistor 422 to the unassigned channel assembly terminal 424 for connection to an unassigned channel board not shown; terminal $R_7$ (FIG. 6c) is connected by lead 426 to the junction of terminals 425, 126 and 432 leading respectively, to the LOC/Remote out pin 13 of quad analog switch 428 (FIG. 6f), and to select front panel terminal 126 (FIG. 4a) and terminal 432 for an option board not shown; and $R_8$ is connected by lead 433 to the power program assembly terminal 434 for an option board not shown.

The outputs of register 386 (FIG. 6d) are as follows:

Terminals Q4A, Q3A and Q2A (pins 10, 3, & 4) are connected by leads 436, 438, and 440 to synthesizer address terminals 442, 444 and 446, respectively (FIG. 7); and terminals Q1B, Q2B, Q3B, and Q4B (pins 13, 12, 11 and 2) (FIG. 6d) are connected by leads 448, 450, 452, and 454 to, respectively, a 25 W/1 W inverter 456 connected to output terminal 780 (FIG. 9a), and synthesizer address terminals 460, 462, and 464 (FIG. 7).

The outputs of register 398 (FIG. 6d) are as follows: terminal Q1A (pin 5) is connected by lead 466 to the junction of USA/INT option board terminal 473, and terminal 474 for option board not disclosed; terminal Q2A (pin 4) (FIG. 6d) is connected by lead 468 to synthesizer address inverters 476 and 478 connected in series with synthesizer address terminal 480 (FIG. 7); terminal Q3A (pin 3) (FIG. 6d) is connected by lead 470 to synthesizer address terminal 482 (FIG. 7), and terminal Q4A (pin 10) (FIG. 6d) is connected by lead 472 to synthesizer address terminal 484 (FIG. 7). The terminal Q1B (pin 13) is connected by lead 468 to unassigned channel assembly terminal 494 (option board not shown), terminal Q2B (pin 12) is connected by lead 488 to enable terminal 496 (FIG. 7), and terminals Q3B and Q4B (FIG. 6d) (pins 11 and 2) are connected, respectively, by leads 490 and 492 to synthesizer address terminals 498 and 500 (FIG. 7).

The outputs of the dual latch 384 (FIG. 6d) are connected as follows: the Q1A, Q2A, Q3A and Q4A terminals are connected by leads 502, 504, 506, and 508 to the tens terminals 218, 220, 222, and 224 (FIG. 4b), and the Q1B, Q2B, Q3B and Q4B terminals (FIG. 6d) are connected by leads 510, 512, 514, and 516 to the units terminals 210, 212, 214, and 216 (FIG. 4b).

The outputs of the dual latch 382 (FIG. 6d) are connected as follows: the Q1A, Q2A, Q3A and Q4a terminals are connected by leads 518, 520, 522, and 524, respectively, to the units blanking terminals 206, tens blanking terminal 208, lock loss terminal 230 and transmit indicate terminal 228 (FIG. 4b); and the Q1B, Q2B, Q3B, and Q4B terminals are connected by leads 526, 528, 530, and 532 to the selector assembly terminals 534, 536, 538 and 540 (for an option board not disclosed).

In operation, the 1 W/25 W power control outputs are generated by the dual 4-bit shift register 386 (FIG. 6d). The microcomputer outputs "$0_o$" through "$0_3$" (FIG. 6c) are input to the shift registers 386 and 398 (FIG. 6d) on command of the microcomputer's "$R_1$" line (FIG. 6c). This process is repeated four (4) times to create a 16-bit word on the outputs of shift registers 386 and 398 (FIG. 6d). Twelve bits represent the synthesizer address and synthesizer enable while one bit controls the state of the 1 W/25 W output. Of the three remaining bits, two are for option boards (power programming & unassigned channel) and one is not used.

The transmitter and receiver on/off control is executed directly by the microcomputer "$R_o$" line. Transmitter inhibit occurs when: the microphone is on the hook, a receive-only channel is selected, phase lock is not achieved, the unit is in the public address (PA) mode, or the push-to-talk switch is not depressed. Keyboard inputs are sensed in the same manner as front panel controls. Outputs of the BCD to decimal decoder 318 are sequentially set high in command of "O" inputs and routed to the "K" input of the microcomputer 306 for status check. The keyboard allows three inputs from the BCD decimal decoder 318 and four outputs to adequately describe all twelve keys.

Display outputs to the front panel are generated by setting "$O_o$" through "$O_4$" to the correct BCD output for the tens or units digit displayed. This data is latched into the latches 384 and 382 of the dual 4-bit latch via control lines "$R_2$" and "$R_3$". Similarly flashing or blanked digits or changes to the decimal states are generated by setting the correct information on the "O" lines of the microcomputer and clocking the data via the "R" lines into latch 382 and clocking the data to the drivers 200, 202, and 204 on the front panel (FIG. 4b).

The actual execution flow of the algorithm as implemented on the TMS 1100 will now be described in a "structured English" format.

Actions are described in English. The control structures for these actions are denoted either by an if-then-else construct or the go-to construct.

For example:

| if | conditional |
|---|---|
| then | |
| | \<statement\> |
| | . |
| | \<statement\> |
| else | |
| | \<statement\> |
| | . |
| | \<statement\> |
| go to | \<label\> |

If the \<conditional\> statement is true then the statements following the then are executed
else
    the statements following the else are executed.

The next statement following the if-then-else is executed unless it contains a go-to statement.

Many of the actions or statements are preceded in the left hand margin by a label. Go-to statements refer to these labels.

The numbers in the circles following action statements refer to the number of actual TMS 1100 instructions required to carry out the action.

```
                # Initialization on Power Up #
                Fill RAM with zeroes    281
                Read hierarchy and Government channel inputs  16
                Clear output comm (communication)
                latch to zero    3
                Set channel status to "16"    5
                Set display status    3
                Init (initiate) 30 sec timer    3
                Init saved channel to 16    3
                If main
                then go to SCANKEYS    6
                Else # Remote #
                    Input SW and info states
                    Go to SCAN    21
                # Debounce Keys, switches, and filter #
                # transient noises #
Filter:         Delay 10 Msec    544
                Read input again    4
                If same input
                Then
                    If switch or info input
                        go to SETSWFLG    6
                    Else # It is a key input #
                        go to CONVINPT    9
                Else # Input was noise #
                    Go to continue scan    9
                # Basic Scan Routine #
                Scan communications input    22 =
                    R10 is doing scanning    440 μsec
                    if request line high then go to
                        ACKNOWLEDGE
ScanKeys:       Scan Keyboard, switch, and info inputs    50
                    if input then go to FILTER
                Scan remote presence and unassigned
                    inputs    8
                Check update flag    5
                    if set then go to UPDTSTAT
ChkSTFLG:       Check status change flag    7
                    if set then go to EXECSTAT
CHKCOMMF:       Check communications flag    5
                    if set then go to SENDSTAT
                Check timer flags (50, 250, 500 msec; 8,
                    30 sec)
```

```
                        if 50 set then go to DISPCHAN    5
CHK QTR:        if 250 set then go to FLASH    5
CHK 500:        if 500 set then go to CHKSCNMD    5
CHK 8:          if 8 set then RSETPAUS    5
CHK 30:         if 30 set then go to RVRT16    5
NCREMNT:        Increment 50, 250, 500 msec timers    7-16
                Go to SCAN
                # Convert Input to Digits #
CONVINPT:       Request control
                if acknowledged
                then
                    convert key input to digit
                    if key was 16/c
                        go to REVERT
                    Else
                        go to PUTDIGIT
                # Put Digit in Status Ward #
PUTDIGIT:       If first entry #of two#
                then
                    enable 30 sec timer
                    blank ones place
                    put digit in tens place
                else # Second Entry #
                    disable 30 sec timer
                    put digit in ones place
                Go to SAVECHNL
                # Revert to Saved Channel or #
                # Channel 16 #
REVERT:         If channel in status = "16"
                then
                    Put saved channel in status
                else
                    put "16" in status
                Go to DISABL30
                # Perform Various End Actions #
DISABL 30:      Disable 30 sec timer
END ERROR:      Reset display flash flag
DISABSCN:       Move switch status byte to input to force switch
                    update after scan mode
UNDOSCAN:       Reset scan mode flags
                Turn off unassigned R line
DISABLT8:       Disable 8 sec timer
                Go to CHKSTFLG
                # FLASH # # Every 250 msec #
FLASH:          Use flash status words to update
                Display status words to cause flashing of
                    ones, tens place digit OR tens decimal point
                    OR ones decimal point.
                Display status
                Go to CHK500
                # Set Switch and Info Update Flags #
SETSWFLG:       Set update flags for those switch of into
                    inputs that have changed from previous state.
                Set global update flag.
                Go to continue scan of inputs.
                # Update Status from Switch and Info Inputs #
UPDT STAT:      If phase lock flag set
                    go to LOCKCHNG
                If hook flag set
                    go to HOOKCHNG
CHKSQ:          If squelch flag set
                    go to SQCHANGE
TESTHK:         If mike on hook
                    reset PTT flag
                If any switch flag set
                    go to CHKMODE
ENDUP:          Reset update flags
                Go to CHKSTFLG
                # Change in Squelch State #
SQCHANGE:       If scanmode
                then
                    if SQ = 1 (break)
                    then
                        set scan pause flag
                        disable 8 sec timer
                        move current scan channel
                            to status for display
                    else # return #
                        enable 8 sec timer
                Go to TESTHK
                # Change in Hook Status #
HOOKCHNG:       Request Control
```

-continued

|  |  |
|---|---|
|  | If ack |
|  | then move hook status from scanning file to status file. |
|  | If mike off hook |
|  | then if scan mode |
|  |     then reset status change flag |
|  |         and comm flag but leave req. line high |
|  |     else #Mike on Hook# |
|  |         revert to channel 16 |
|  | Go to CHKSQ |
|  | # Change in Phase Lock State # |
| LOCKCHNG: | If lock gained |
|  | then |
|  |     set phase lock status flag |
|  | else # Lost # |
|  |     Reset phase lock status flag |
|  | Demand control |
| LOCKONOF: | If lock gained |
|  | then |
|  |     if transmit mode |
|  |     then |
|  |         enable transmitter # R Line High # |
|  |         disable receiver # R Line Low # |
|  | Else |
|  |     Disable transmitter # R Line Low # |
|  |     Disable receiver Ignore R Line High # |
|  | Go to CHKHOOK |
|  | NOTE: LOCKONOF as a subroutine is performed every 50 msec |
|  | # Change in Switch State # |
| CHKMODE: | If scan mode |
|  | Then if scan pause |
|  |     Then if PTT flag set |
|  |         Then |
|  |             Request control |
|  |             if ACK |
|  |             then PTT= φ (Depressed) |
|  |                 undo scan |
|  |         Else |
|  |             Ingnore switch changes |
|  |             Make sure PTT = 1 |
|  | Else |
|  |     Request control |
|  |     If ACK |
|  |     Then if mike off hook |
|  |         then if PTT released |
|  |             then |
|  |                 move new switch states to status word |
|  |         else # PTT Depressed # |
|  |             ignore new SW states except PTT |
|  |             if new PTT released |
|  |             then set new PTT state |
|  |     else # Mike on Hook # |
|  |         move new SW states to status |
|  |         make sure PTT = 1 |
|  | Go to ENDUP |
|  | # Go to Next Channel in Scan Mode # |
|  | # Performed every 500 msec |
| CHKSCNMD: | If scan mode |
|  | Then |
|  |     If scan pause |
|  |     Then go to INCREM30 |
|  |     Else |
| NEXT CHAN: |         set status change flag |
|  |         increment scan channel |
| NCREM30: | If 30 sec timer enabled |
|  | Then |
|  |     Increment 30 sec timer |
|  | Go to INCREM8 |
| NCREM8: | If 8 sec timer enabled |
|  | then |
|  |     increment 8 sec timer |
|  | Go to CHK8 |
|  | # Time Out After Return of Squelch # |
|  | # In Scan Mode (8 Sec Time Out) # |
| RSETPAUS: | Reset scan pause flag |
|  | Move Sel 0 to status for display |
|  | Go to NEXTCHAN |

-continued

|  |  |
|---|---|
|  | # Revert to Channel 16 after 30 sec # |
| RVRT16 | Revert to channel 16 |
|  | Request control |
|  | Go to INCREMNT |
|  | # Performed Every 50 msec # |
|  | # Display Current Channel and Status # |
| DISPCHAN: | If ones place = blank or sel |
|  |     reset ones bit in display status byte |
|  | If tens place = blank or sel |
|  |     reset tens bit in display status byte |
|  | Output display status |
|  |     # Bring R line high then low # |
|  | Output ones digit |
|  |     # Bring R line high then low # |
|  | Output tens digit |
|  |     # Bring R line high then low # |
|  | # Performed every 50 msec # |
|  | # Check for Change in Remote Presence # |
| CHKREMPR: | If remote presence has change from off to on |
|  | Then |
|  |     request control |
|  | Go to CHKQTR |
|  | # Save Channel Just Entered # |
| SAVECHNL: | If entry two # of two # |
|  | Then |
|  |     If not Sel φ |
|  |     Then |
|  |         if not channel 16 |
|  |         then |
|  |             save channel number |
|  | Go to ENDERROR |
|  | # Execute New Status # |
| EXECSTAT: | If main |
|  | Then |
|  |     Disable transmitter #R Line Low# 8 |
|  |     If not scan mode |
|  |     Then |
|  |         Disable receiver #R Line High# 5 |
|  |     If entry one #Of Two# |
|  |     Then |
|  |         Disable synthesizer 7 |
|  |         Output execution word 2 |
|  | Else |
|  |     If not scan mode |
|  |     Then |
|  |         Move channel to work area |
|  |         Build execution word status byte |
|  |             # PA, wattage, USA/INT, XMITRECV# |
|  |     Reset receive only status |
|  |     Go to CONVCHAN |
| ENDEXCST: | If flash flag set |
|  |     Demand control |
|  | If receive only flag set |
|  |     Demand control |
|  | Go to CHKCOMMF |
|  | # Sel Channels: Presets and Scan Mode # |
| SELZERO: | If channel not = Sel 0 |
|  | Then |
|  |     Go to ERROR99 |
|  | Set scan mode flag |
|  | Initialize scan channel to Sel 5 |
| PRESETS: | Input actual channel number from preset switches |
|  | Set USA/INT flags according to number entered from switches |
|  | Go to CONVCHAN |
|  | # Set up Error Display # |
| ERROR: | Turn off unassigned output |
|  | If scan mode |
|  | Then |
|  |     Increment Scan channel |
|  |     Go to CONVCHAN |
|  | Else |
|  |     Put 99 in channel status |
|  |     Set flash and receive only flags |
|  |     To to POWEROUT |
|  | # Convert Channel to Binary for # |
|  | # Power Programming Output # |
| POWEROUT: | Convert channel number to binary 20- |
|  | # Channel 00 to Binary 0, etc # |
|  | Output lower order 4 bits of binary coded |

```
                    channel number   2
                Bring R line high  4
                Output high order 4 bits of binary coded
                    Channel number   5
                Bring R line low   4
                Go to EXCST  2
                # Build Synthesizer Address from Channel
                    Number #
CONVCHAN        Validate channel number
                If not valid
                Then
                    Disable synthesizer
                    Convert channel to special binary code
                    Go to OUTPUTEX
                If Sel φ
                Then    Go to SELZERO
                If Sel 5 thru Sel 9
                Then    Go to PRESETS
                Convert validated channel number from
                    φ1-29, 60-89, and Sel 1-Sel 4
                    to synthesizer address.
                Set receive only and 1W inhibit flags
                If transmit mode
                Then
                    Move transmit address to execution word
                        output buffer
                Else    #Receive Mode#
                    Move receive address to execution word
                        output buffer
                Go to OUTPUTEX
                # Output Execution Word #
OUTPUTEX:       Output execution word to 16 bit shift register 70
                if synthesizer disabled
                Then
                    Set unassigned R line high   5
                    Read unassigned inputs    9
                    If unassigned input high
                    Then
                        Enable synthesizer
                        If unassigned receive only input high
                        Then
                            Revert to receive mode
                            Go to OUTPUTEX  13-19
                        Else #Channel not on option board#
                            Go to ERROR99   7
                # Request Control #
REQUEST:        If remote present
                Then
CHKREQ:             If REQ input line low
                    Then
                        Output REQ high
                        Wait for ACK input high
                        If ACK high
                        Then
                            Set comm flag
                            Set status change flag
                            Reset local/remote R line low
                            Return
                            Else #Request Denied#
                                Return
                    Else #REQ Input High; Other Unit in
                        Control#
                        # Request Denied#
                        Return
                Else # Remote Not Present#
                    If main
                    Then set status change flag
                        Reset local/remote R line; Return
                    Else go to CHKREQ
```

POWER SUPPLY

Referring now to FIGS. 6e and 6f, the transceiver power supply comprises a terminal 172 (6e) for receiving the 13.8 voltage from the main source thereof (FIG. 4a), and a second terminal 172′ for receiving the voltage from the remote unit source. Terminal 172 is connected to the junction of a line filter 542 and a choke input filter 544 and to regulators 546 and 548. Filter 542 is connected to the remote unit terminal 172′ to remove any ac from the dc source. The output of the filter 544 is connected by lead 550 to switching transistors 552 and 554 (FIG. 6f). Regulator 548 (FIG. 6e) is connected to the junction of leads 558 and 560. Lead 558 carries the 5 v to all 5 v points (FIG. 6f). While lead 560 (FIG. 6a) connects the 5 vdc output of regulator 548 to the junction of the positive terminals of oscillator 566, comparator 568 and a summing amplifier 570 (FIG. 6e & 6f). The master oscillator 566 which operates, for example, at 29.27 KHz generates a triangular waveform. This waveform is compared in comparator 568 with the five vold d.c. output generated by the voltage division of resistor 572 and resistor 574, and summed in the summing amplifier 570. The output is used to trigger the switching transistors 552 and 554 at the duty cycle required to regulate the 180 v supply. The ac output of the switching transistors is applied to the primary of a transformer 576. The unfiltered 180 v is produced by the step-up transformer 576, and rectified by rectifier 578. The rectified 180 v is then filtered by capacitor 580 to produce the regulated 180 volts at terminal 232 for displays 42 and 44 (FIG. 4b).

RECEIVER AND SYNTHESIZER BOARD

The synthesizer 16 (FIG. 3) is shown in block diagram in FIG. 7; and will be described in conjunction therewith. Those skilled in the art desiring a more complete description are referred to U.S. Pat. No. 4,186,342 issued Jan. 29, 1980 for "A Marine Radio Telephone."

Referring now to FIG. 7, the microphone 16 is shown connected by line 600 to a microphone amplifier/limiter 601. Limiter 601 receives inputs from microphone audio return terminal 113, select microphone audio 1000, and handset side tones 122 (FIG. 4a). The microphone output is connected by line 602 to a low pass filter 604. The filter output is connected by lines 606 and 606′ to a pole of switch 50. Switch 608, which is, for example, a CD4016C, contains four single pole, double throw switches. Switch 50 is connected by line 610 to a switch control 612.

The switch control 612 receives transmit/receive indicating signals from terminal 408 of the microprocessor 306 ($R_o$) (FIG. 6c) and transmit/PA control signals from terminal 458 of the PA switch (FIG. 4a). When the transmit/receive control is in the receive mode, the switch 608 is connected through the volume and audio amplifier 52 (FIG. 3) to the speaker and when the transmit/PA control is in the PA mode, the microphone is connected through the limiter 601, LPF 604, line 606′, switch 50 (FIG. 7) terminal 608 audio output (FIG. 7) to remote audio and volume control terminals 1008 and 180 (FIG. 4a) to the speaker 22. Conversely when the transmit/receiver control is in the transmit mode, the receiver circuit 20 (FIG. 3) is grounded and when the transmit/PA control is in the transmit mode the microphone is connected from switch 50 by line 614 to the amplifier/low pass filter 616 and through line 618 to the voltage control oscillator 620 where it modulates the carrier signal.

The voltage controlled oscillator 620 receives as another input a frequency correction dc voltage through line 622 from a loop filter 624 of a phase lock loop, hereinafter described. The output of the VCO 620 is connected by line 626 to a buffer 628 for buffering. The buffer 628 is connected by line 630 to a local oscillator (LO) driver 632. The output of the LO driver 632 is connected by line 634 to local oscillator terminal 636

Figure 9A:
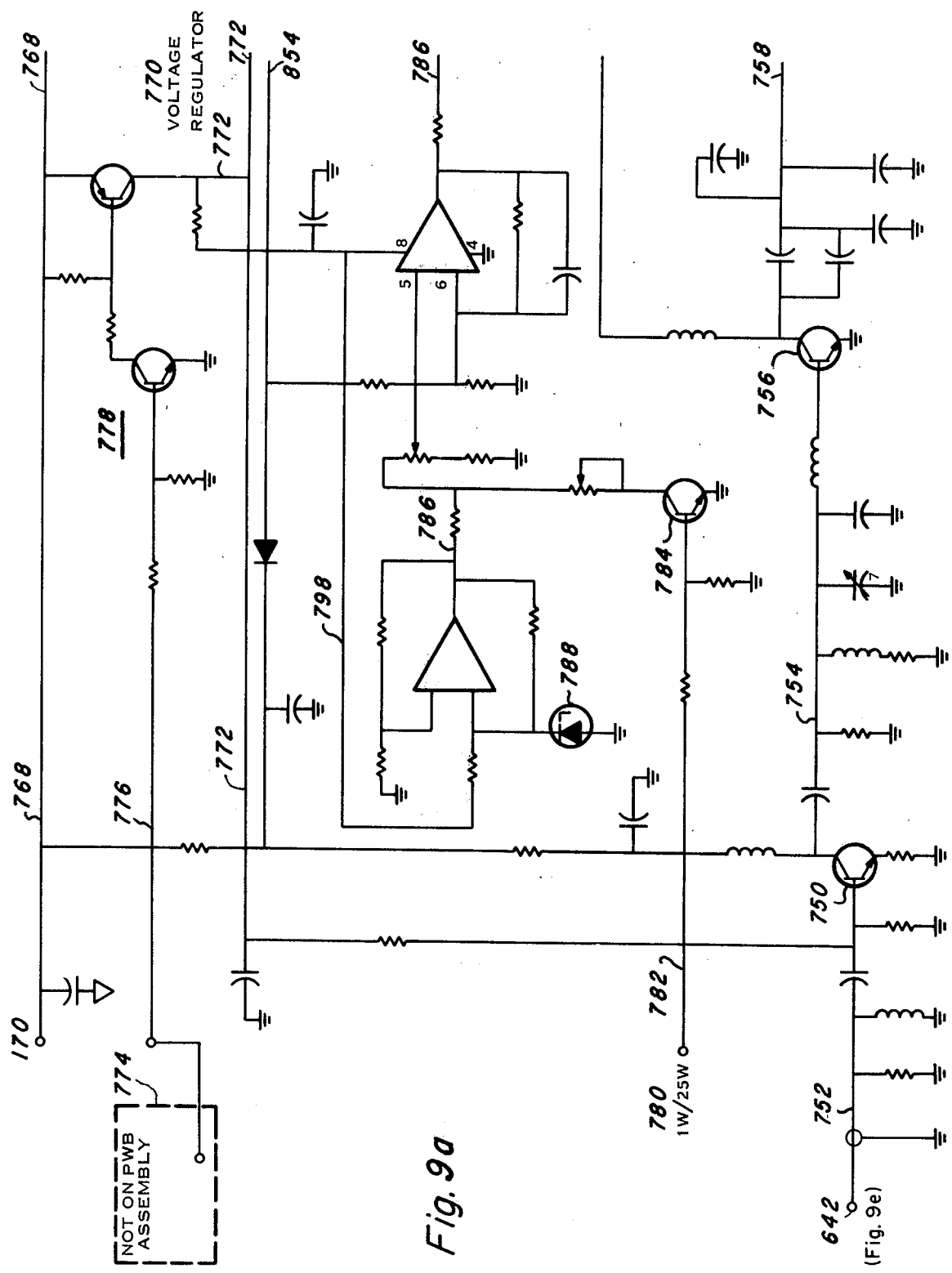
FIGS. 9a–9b are schematics of the transmitter printed wiring board.

(FIG. 8a), by line 638 (FIG. 7) to junction of a transmit inhibit lead 694 and a class A amplifier 640 and by line 644 to buffer 646. Amplifier 640 has its output connected to transmittal terminal 642 (FIG. 9a). The buffer 646, which is connected by line 648 to amplifier 650, buffers the phase lock loop feedback signal for amplification by the amplifier 650. The amplifier feedback signal of amplifier 650 is applied through line 652 to a divide by 10/11 counter 654.

The divide by 10/11 counter 654, which is connected by line 656 to a programmed prescaler control 658, is controlled by the output of the program prescaler controller 658. The programmed prescaled controller 658 receives the channel selected word through terminals 442, 464, 484, and 500 of the shift registers 386 and 398 (FIG. 6d) and provides the divide by 10/11 counter 654 (FIG. 7) with the number of 10 and 11 divisions to be made by the programmable divider 662 depending upon the channel selected. The output of the divide by 10/11 counter 654 is connected by line 660 back to the clock terminal of the programmed prescaler control 658 and to a programmable divider 662.

The programmable divider 662 receives the synthesizer address through leads 462, 482, 494, 496, 446, 460 and 480 of shift registers 386 and 398 (FIG. 6d), and divides the output of the divide by 10/11 counter to provide a preselected (25 KHz) signal through line 664 to a phase detector 666 and to a reset gate 668. The reset gate 668 provides reset signals to the programmed prescaler controller 658 and the programmable divider 662. The phase detector 666 also receives through line 670 a 25 KHz signal from a "divide by 128" 672 which divides a 3.2 MHz buffered signal to provide the 25 KHz signal. The divide by 128 divider 672 is connected by line 674 to buffer 676, and the buffer 676 is connected by line 678 to the 3.2 MHz crystal oscillator 680. Phase detector 666 compares the phase of the phase lock loop signal to the 25 KHz signal of the crystal oscillator and provides an output through line 682 to a phase lock bit generator 684 and line 686 to the phase loop filter 624.

The phase lock bit generator 684 produces at terminal 521 (FIG. 6a) the phase lock indicating signal. The phase lock bit generator 684 is also connected by line 690 to transmit inhibitor 692. The transmit inhibitor 692 is connected by lead 694 to amplifier 640. When not in transmitting mode or phase locked the transmit inhibitor 692 inhibits the amplifier 640 and transmit signals to the transmit terminal 642 (FIG. 9a) are cut off. If the receiver is in lock, a zero phase difference signal is produced by the loop filter 624 for the VCO 620 and if the receiver is not in lock the loop filter produces a dc voltage correction signal for the VCO. A regulator 696 is connected to power source terminal 174 (FIG. 4a) and provides an 8.5 voltage to buffer 646, LO driver 632, buffer 628, VCO 620, AMP LPF 616 and switch 50.

RECEIVER

Referring now to FIGS. 8a–8d, the receiver 20 (FIG. 3) of the receiver/synthesizer board includes a preselector 700 (FIG. 8a) connected by lead 702 to the receiver side of a duplexer switch 704. The duplexer switch is connected to an antenna (not shown) and permits use of the antenna during either receiver or transmitter operation. The preselector 700 is connected by lead 706 to a preamplifier 708. The preselector and preamplifier constitute a tuned RF amplifier stage which increases the selectivity and sensitivity of the receiver.

The output of the preamplifier 708 is connected by lead 710 to a first mixer 712. The first mixer 712 is also connected by lead 714 to a local oscillator filter 716 whose input is connected to terminal 636 of the synthesizer (FIG. 7). The synthesizer acts as the local oscillator for the first mixer stage 712. The incoming frequency is mixed with that of the synthesizer in the first mixer 712 and the sum frequency (10.7 MHz) is connected by lead 718 to the first intermediate frequency (IF) amplifier 720. The IF amplifier, which may be, for example, an SD6000, is permanently tuned to the constant sum frequency output of the mixer.

The IF amplifier 720 is connected by lead 722 to a second mixer oscillator 724 (FIG. 8b). The second mixer oscillator, which is, for example, an SD6000, is tuned to 10.245 MHz to produce a 455 KHz signal at its output. The second mixer 274 is connected by lead 726 to a second IF amplifier 727. The second IF amplifier is, for example, a MCC33106 tuned to the 455 KHz signal. The second IF amplifier is connected by lead 728 to the discriminator 48.

The discriminator, which is, for example, a 3089, has its pin 5 connected by lead 730 to the output of a squelch amplifier detector 732 (FIG. 8c). The squelch amplifier detector (FIG. 8c) is connected by lead 734 to the squelch amplifier 736 (pin 11). Squelch amplifier 736 is, for example, an LM370N whose input pins 1 and 4 are connected, respectively, to a filter 738 and squelch control terminal 162 (FIG. 4a). The filter 738 is connected by lead 740 to the output (pin 7) of the discriminator 48 (FIG. 8b). The audio signal and any noise is fed to filter 738 (FIG. 8c) which passes the noise signal to amplifier 736. Pin 14 of the squelch amplifier 736 is connected by lead 742 to receiver power control terminal 744 (FIG. 4a). As the squelch control 32 (FIG. 2) is advanced from the off position, an increasing positive voltage is applied through pin 4 of the squelch amplifier 736 (FIG. 8c) and a squelch voltage is applied through the detector 732 and lead 730 to the discriminator (pin 5) 48 (FIG. 8b). As the squelch voltage is increased the RF energy is decreased to reduce the noise. This arrangement provides a very sensitive squelch control.

The output of the discriminator 48 (pin 6) (FIG. 8b) is connected to the volume control terminal 190 (FIG. 4a). The volume control terminal 180 is connected by lead 742 (FIG. 8d) to pin 8 of audio amplifier 52. The audio amplifier 52 output is connected by lead 744 to terminal 93 audio (FIG. 4a). Power for the receiver is from the +13.8 power supply terminal 174 (FIG. 4a) connected to a power switch 746.

TRANSMITTER

Figure 9B:
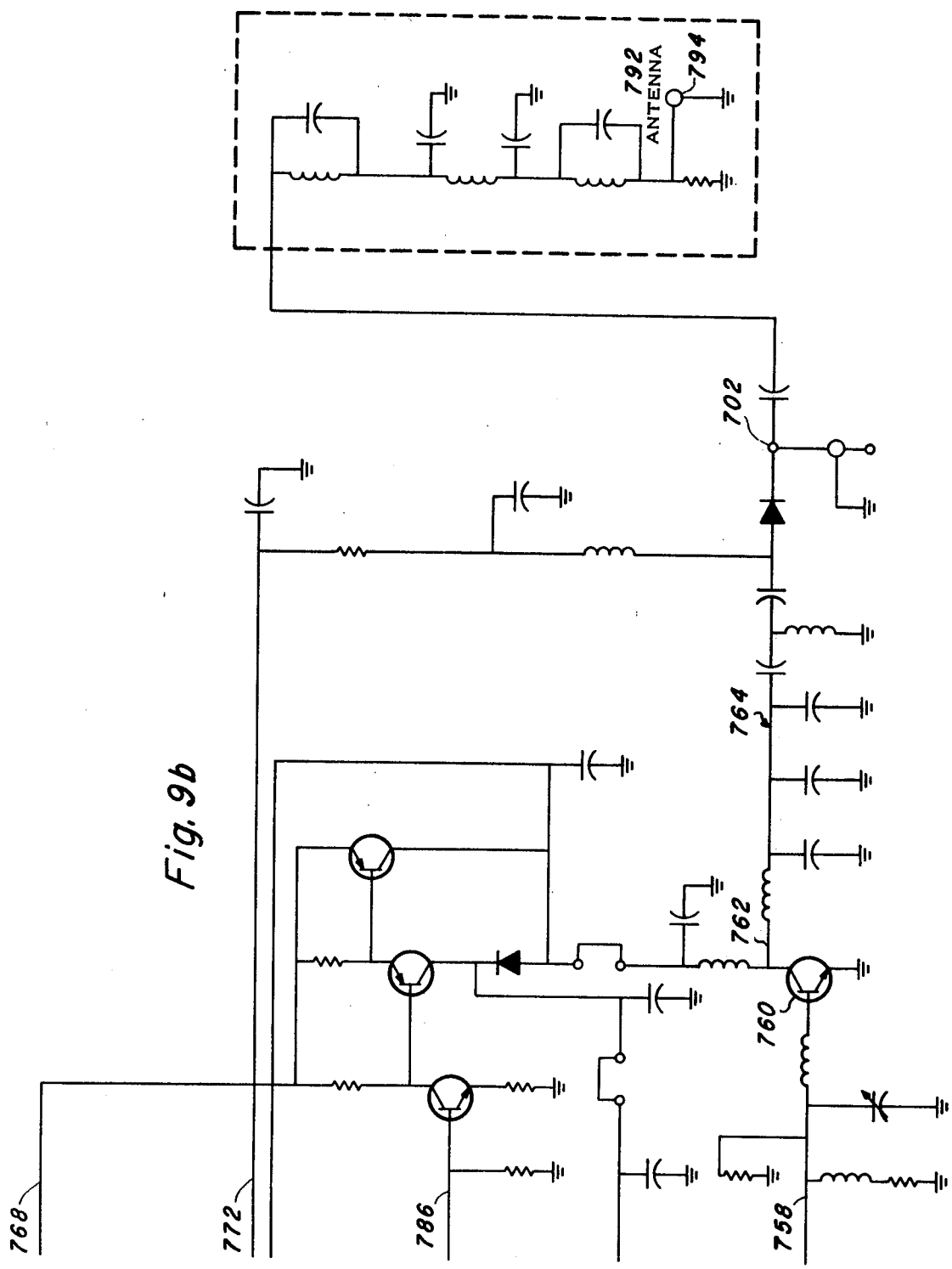

Referring now to FIGS. 9a and 9b, the transmitter PWB comprises an RF drive channel which includes a buffer amplifier 750 (FIG. 9a) connected by lead 752 to transmit terminal 642 (FIG. 7). The buffer enhances the modulated RF modulated signal of the synthesizer. The buffer amplifier 750 (FIG. 9a) is connected by lead 754 to amplifier 756 and by lead 758 to a tuned power amplifier 760 (FIG. 9b). The power amplifier output is connected by lead 762 through a low pass filter 764 to the receiver coaxial cable terminal 702. Power from terminal 170 (FIG. 4a) is connected by lead 768 (FIG. 9a) to a voltage regulator 770 and the output of the voltage regulator is connected by lead 772 to the RF drive channel buffer amplifier 750.

The voltage regulator 770 (FIG. 9a) is controlled by the transmit/receive signal from terminal 774 connected by lead 776 to a transistor switch 778 (FIGS. 3 & 9a) of the voltage regulator 770. The switch 778 controls the output of the voltage regulator to disable the transmitter during operation of the receiver. The high/low power terminal 780 (FIG. 6d) is connected by lead 782 (FIG. 9a) to power switch 784. Power switch 784 is connected by lead 786 to a zener diode 788 which is connected by lead 798 to the voltage regulator 770. The zener diode 788 controls power surges.

A coaxial cable interconnects terminal 702 (FIG. 9b) to a duplexer switch 792 connected to the antenna 794 (FIG. 9b). The RF signals are transmitted by the antenna 794.

UNIT OPERATION

Figure 10A:
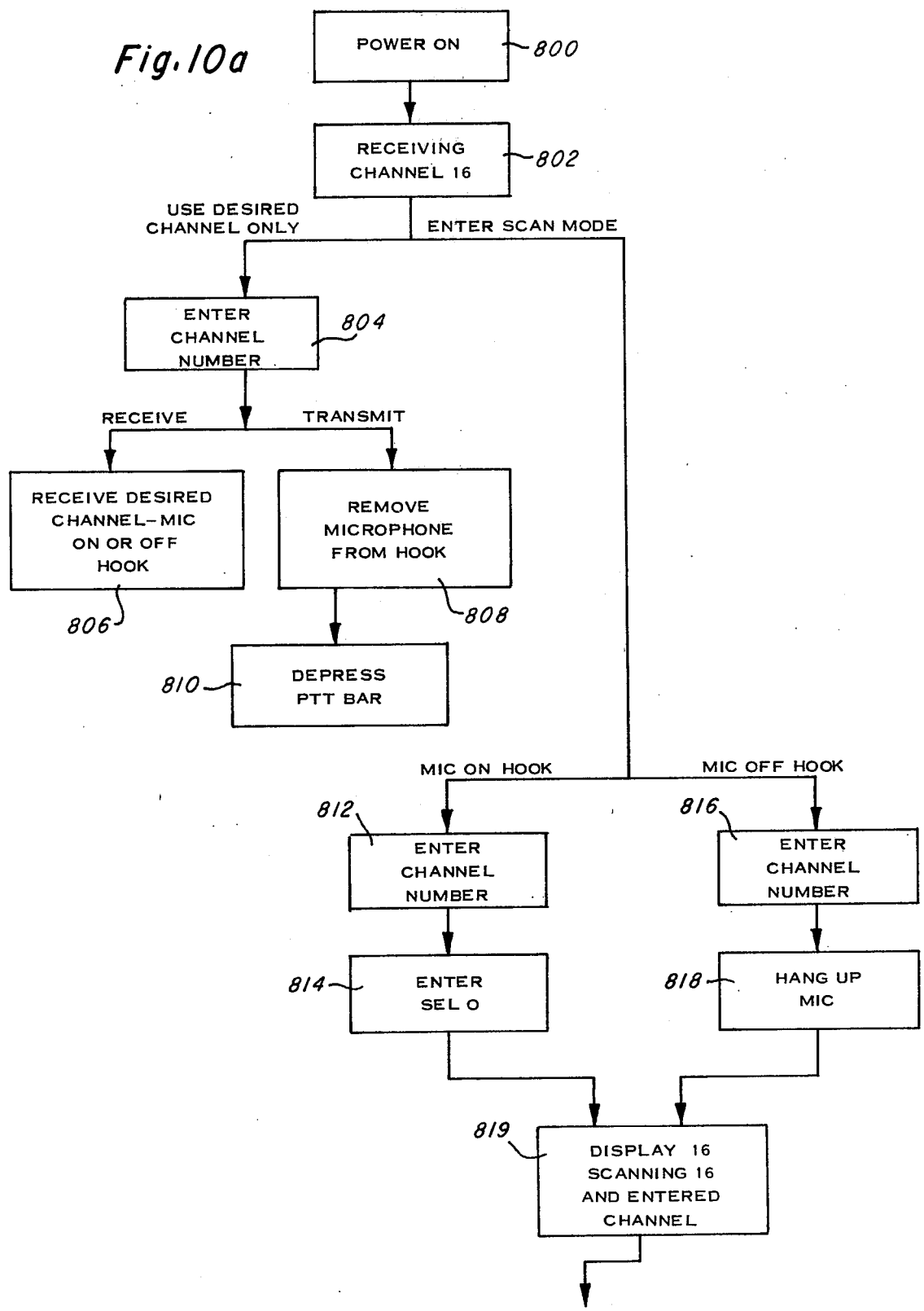
FIGS. 10a and 10b are flow diagrams of the radio telephones operation.
Figure 10B:
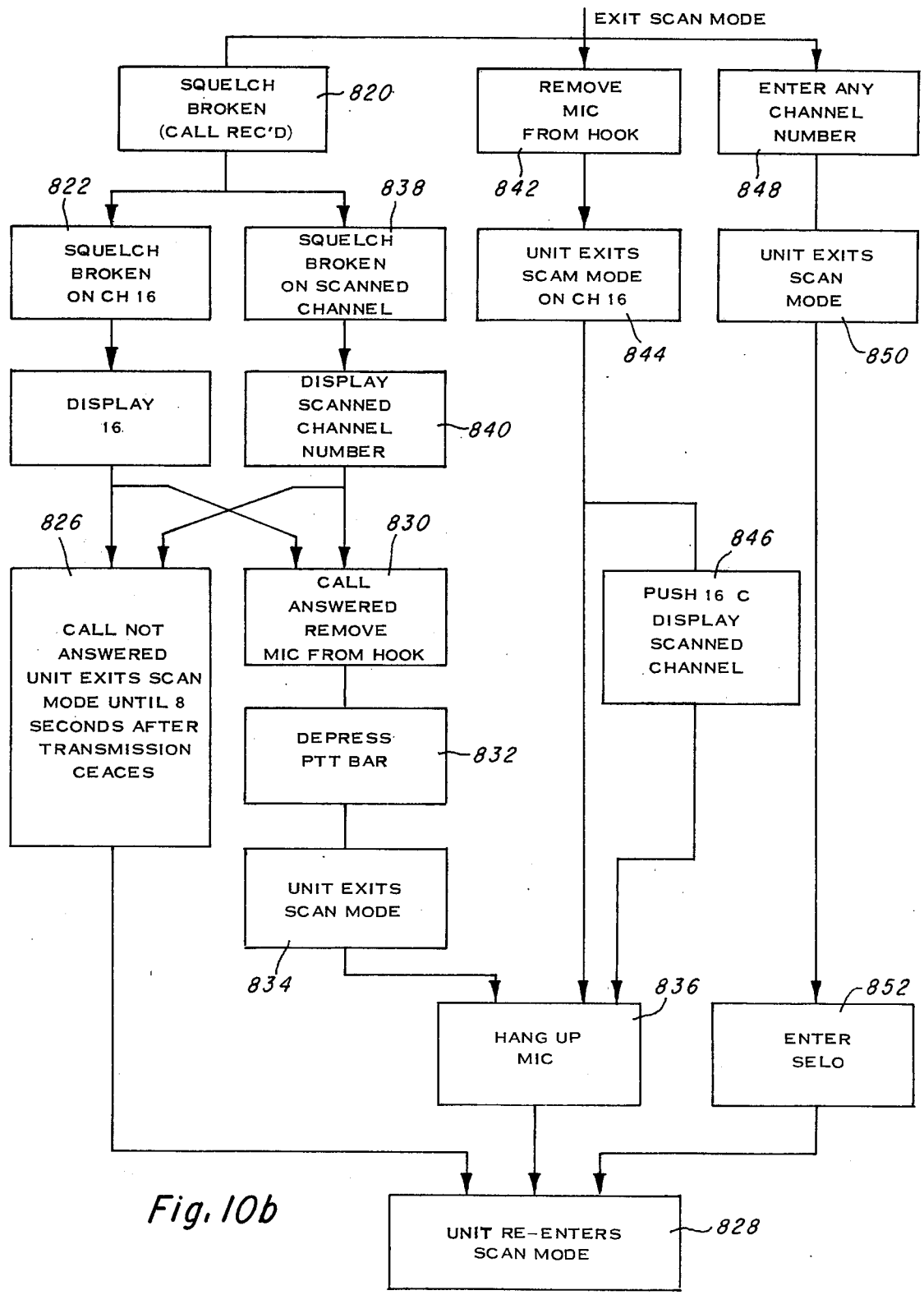

Referring now to FIGS. 10a & 10b, the operation of marine radio/telephone is shown in flow chart form. With power on 800, the microprocessor automatically monitors the emergency channel "16" 802 in the receiving mode. To switch to a desired channel, the channel is entered 804 through the keyboard. The marine radio/telephone is then ready to receive on the selected channel with the microphone either on or off the microphone hook 806. To transmit over the selected channel the microphone is removed from its hook 808 and the push to talk bar is depressed 810.

To enter a dual scanning mode, which includes a selected channel in addition to the emergency channel 16, from the receiving channel "16" mode 802 the microphone can be either left on the hook or removed therefrom. If the microphone is left on the hook, the desired channel is entered 812 through the keyboard and then "Sel" and "0" is entered (814). If the microphone is off the hook, the desired channel is entered 816 and the microphone returned 818 to its hook. The emergency channel and the selected channel are then alternately scanned (0.5 sec. each) while "16" is displayed 819.

The dual scanning mode is changed when: a call is received, the microphone is removed from the hook, or any channel number is entered. When a call is received, squelch is broken 820 (FIG. 10b). One one hand, if squelch is broken on channel "16" 822 the number "16" is displayed 824 on the display. If the call is not answered within eight seconds after the transmission ceases 826, the unit reenters the scan mode 828. However, if the call is answered by removing the microphone 36 from hook 830 and depressing the push-to-talk bar 832, the unit remains out of the scanning mode 834 until the microphone is returned 836 to its hook. When the microphone is hung up, the unit reenters the dual scan mode 828.

On the other hand if squelch is broken 838 on the scanned channel, the scanned channel number 840 is displayed. If the scanned channel call is not answered within eight seconds after transmission ceases (826) the unit reenters the dual scan mode 828. However, if the channel number call is answered by removing 830 the microphone hook and depressing 832 the push-to-talk bar, the unit exits 834 the dual scan mode until the microphone is returned 836 to its hook, at which time the unit reenters the dual scan mode.

In the absence of a call, when the microphone is removed 842 from its hook, the unit exits 844 the dual scan mode and the unit is on channel "16", the scanned channel can be obtained 846 with the "16/c" key.

Finally, if it is desired to monitor another channel, the channel can be changed by entering 848 the new channel number through the keyboard; at which time the unit exits 850 the dual scan mode. Then the "Sel" and "0" keys are pressed to enter 852 the "Sel 0" and the unit reenters the dual scan mode.

Although only a single embodiment of this invention has been described herein, it will be apparent to a person skilled in the art that various modifications to the details of construction shown and described may be made without departing from the scope of this invention.

What is claimed is:

1. A communication device comprising:
 (a) a plurality of operational controls, said controls including a data entry means for multiple channel number selections for incoming call monitoring, and operational status selecting means for selecting operational functions;
 (b) a multiplexer connected to the plurality of operations controls for producing in sequence signals indicative of operator selected channel numbers and operational functions;
 (c) a plurality of circuits including logic gates with first input terminals connected selectively to the multiplexer for receiving the electrical signals indicative of selected channel numbers and operational controls, second input terminals for receiving data loading signals, and output terminals;
 (d) an encoder selectively connected to the logic gates' outputs for encoding the output signals;
 (e) a microcomputer having input terminals connected to the encoder's output terminals for receiving the coded output thereof, said microcomputer operative to produce: loading signals, transmitter inhibiting signals responsively to selected operational function signals, alternately signals indicative of selected channel numbers for receiver scanning, and operational signals, said microcomputer having output terminals including a portion thereof connected to the second input terminals of the logic gates for loading the microcomputer with the logic gates' information responsively to receipt of the microcomputer's loading signals;
 (f) a plurality of shift registers connected to selected outputs of the microcomputer, said shift registers operatively responsive to data outputs of the microcomputer for producing display activating signals and, alternatively bit words during receive each bit word comprising a synthesizer frequency address, a synthesizer enable signal and a power output selection signal, and a bit word during transmission including a carrier frequency address for a selected channel frequency;
 (g) a display connected to the selected shift registers for displaying selected functional information;
 (h) a microphone for producing audio frequencies;
 (i) a frequency synthesizer selectively connected to the plurality of shift registers and microphone for producing frequencies responsively to the frequency synthesizer enable signals and frequency addresses of the bit words during receive, and a modulated signal by modulating the RF frequency of the frequency address and the audio frequency of the microphone during transmit; and
 (j) a transceiver including a receiver/transmitter inhibiting means, a receiver and a transmitter, said inhibiting means connected to the microcomputer and said receiver and transmitter connected to the frequency synthesizer, said receiver/transmitter inhibiter means responsively to the microcomputers' transmitter inhibiting signals to inhibit the transmitter during receive, said receiver operative to receive the RF frequencies for the selected channels from the frequency synthesizer during receive and to produce any audio frequency present, and said transmitter operative to transmit the modulated frequencies of the frequency synthesizer during transmit.

2. A communications device according to claim 1 wherein the plurality of circuits include selected circuits for "receive only" channel usage, said "receive only" circuits including an element which can be inactivated for converting the "receive only" circuit to a receive-transmit circuit when authorized.

3. A communication device according to claim 2 wherein the element is a diode, which can be shorted.

4. A communication device according to claim 1 wherein the data entry means for channel selection is a keyboard of push buttons.

5. A communication device according to claim 4 wherein the keyboard includes keys for digits "0"–"9", emergency channel "16" and select (SEL) for use in selecting a weather channel.

6. A communications device according to claim 2 wherein the plurality of selected channels monitored for incoming calls include an emergency channel 16 and at least one other preselected channel.

7. A communication device according to claim 1 wherein each channel of the plurality of selected channels monitored for incoming calls are alternately monitored for a first preselected time interval, and upon receipt of a call on one of the selected channels the time interval for that channel is for a second preselected time interval during which if the call is answered the monitoring ceases, and if not answered within the second time interval monitoring of the selected channels is resumed at the first time interval.

8. A communication device according to claim 7 wherein the first time interval is about 0.5 seconds and the second time interval is about 8 seconds.

9. A communication device according to claim 1 further including a programmed power printed wiring board connected to the microcomputer for receiving information as to the selected power setting for a selected transmitting channel for automatically changing the power setting to the setting required for transmission in the area of transmission.

10. A communication device according to claim 8 wherein the microcomputer further includes a terminal for an unassigned channel ROM for an address code for any newly assigned channel from presently unassigned channels.

* * * * *